United States Patent
Tanabe et al.

(10) Patent No.: US 6,195,771 B1
(45) Date of Patent: Feb. 27, 2001

(54) SEMICONDUCTOR DEVICE HAVING SEMICONDUCTOR MEMORY CIRCUIT TO BE TESTED, METHOD OF TESTING SEMICONDUCTOR MEMORY CIRCUIT AND READ CIRCUIT FOR SEMICONDUCTOR MEMORY CIRCUIT

(75) Inventors: Tetsuya Tanabe; Satoru Tanoi; Yasuhiro Tokunaga, all of Tokyo (JP)

(73) Assignee: Oki Electric Industry Co., Ltd, Tokyo (JP)

( * ) Notice: Subject to any disclaimer, the term of this patent is extended or adjusted under 35 U.S.C. 154(b) by 0 days.

(21) Appl. No.: 08/807,462

(22) Filed: Feb. 27, 1997

(30) Foreign Application Priority Data

Sep. 5, 1996 (JP) .................................................. 8-235270

(51) Int. Cl.[7] .................................................. G11C 29/00
(52) U.S. Cl. .......................... 714/718; 714/719; 714/720; 365/201; 365/230.03
(58) Field of Search .................................... 714/718, 719, 714/720, 738, 742, 743; 365/189.01, 201, 230.03

(56) References Cited

U.S. PATENT DOCUMENTS 4,559,626 * 12/1985 Brown .................................. 371/21.1
5,706,234    1/1998 Pilch, Jr. et al. ..................... 365/201

FOREIGN PATENT DOCUMENTS 8-161899    6/1996 (JP) .
9-197009  * 7/1997 (JP) .

OTHER PUBLICATIONS

ISSCC91/Session 5/Microprocessors/Paper TA 5.5.
ISSCC91/Session 6/High–density DRAM/Paper TA 6.4.
A 55ns 16Mb DRAM with Built–in–Self–Test Function Using Micro–Program ROM (pp. 79–85).
Design and Test of Computer (pp. 204–209).

* cited by examiner

*Primary Examiner*—Emmanuel L. Moise
(74) *Attorney, Agent, or Firm*—Rabin & Champagne, P.C.

(57) ABSTRACT

Disclosed herein is a semiconductor device having a semiconductor memory circuit whose operation is tested in combination with an external test means to specify defective portions produced in a memory section of the semiconductor memory circuit and shorten the time necessary for its test. The present semiconductor device comprises a test pattern generator for generating a test pattern indicative of the type of test and an expected value estimated to be obtained by the test pattern in response to a command issued from the test means, the semiconductor memory circuit, which has a plurality of memory cells disposed in the form of a matrix with rows and columns and respectively store data therein and is activated based on the test pattern so as to output data in the respective memory cells every columns, a decision unit for comparing each output data with the expected value and outputting the result of comparison therefrom and a translation unit for converting the result of comparison into address data and outputting it to the external test means.

23 Claims, 26 Drawing Sheets

(Pretreating Process)

(Wafer Test Process)

(SCRIBE PROCESS)

(CLASSIFYING PROCESS)

SEMICONDUCTOR DEVICE HAVING SEMICONDUCTOR MEMORY CIRCUIT TO BE TESTED, METHOD OF TESTING SEMICONDUCTOR MEMORY CIRCUIT AND READ CIRCUIT FOR SEMICONDUCTOR MEMORY CIRCUIT

BACKGROUND OF THE INVENTION

1. Field of the Invention

This invention relates to a semiconductor device having a semiconductor memory circuit whose operation is tested in combination with an external test means, a layout of the semiconductor device and a method of testing the semiconductor memory circuit.

2. Description of the Related Art

A built-in self test (hereinafter called "BIST") has been known as a test on the operation of a semiconductor device. As references about the BIST, there have been disclosed the following ones: (1) "A 45 ns 64 Mb DRAM with a Merged Match-line Test Architecture", S. Mori et al, IEEE, Dige. of Tech. Papers, P. 110–111, 1991, (2) "Design and Test on Computer", by H. Fujiwara, issued by Engineering book publisher, P204–208, and (3) "55 ns 16 Mb DRAM provided with a Self-Test Function", Koike et al, Singaku Giho SDM69–39, P79–85, 1999, etc.

Further, "A zero-Overhead Self-Timed 160 ns 546 CMOS Divider" Williams, T. E. et al, ISSCC, Dig. of Tech. Papers, P98–99, 1991 has been disclosed as a reference about a method of controlling a FIFO (First-In First-Out) circuit related to a test.

In the prior art typified by the above-described disclosures, however, since the amount of transfer of data between a semiconductor device and an external test means increases with a great increase in the capacity of a memory portion of a semiconductor memory circuit, the time required to test the semiconductor memory circuit becomes longer. An increase in the rate of compression of data is also considered as a method of reducing the amount of transfer of the data therebetween. It is however understood from the result of a test based on compressed data that only the test for making a decision as to whether the compressed data is good or bad for each unit of the compressed data, can be realized. It is thus difficult to specify positions where defective data are produced. This will exert an influence on the relief of redundancy of the semiconductor memory circuit having large capacity.

Namely, the relief of its redundancy is intended for the improvement in yield by the replacement of a defective memory cell with a spare memory cell for its relief. However, the non-pinpointing or determination of the position of the defective memory cell will make it difficult to carry out the redundancy relief or will cause needless usage of a memory cell used for the relief of its redundancy because the redundancy relief is performed for each large-scale unit.

SUMMARY OF THE INVENTION

Typical ones of various inventions, which have been made by the inventors of the present application to solve the problem typified above, are shown below. The inventions other than the inventions to be described below will be understood from a detailed description to be explained later.

Namely, there is provided a semiconductor device having a semiconductor memory circuit whose operation is tested in combination with an external test means, which comprises:

a test pattern generator for generating a test pattern indicative of the type of test and an expected value estimated to be obtained by the test pattern in response to a command issued from the test means;

the semiconductor memory circuit having a plurality of memory cells disposed in the form of a matrix with rows and columns, for respectively storing data therein, and being activated based on the test pattern so as to output the data stored in the respective memory cells column by column;

a decision unit for comparing each outputted data with the expected value and outputting the result of comparison therefrom; and a translation unit for converting the result of comparison into address data and outputting it to the external test means.

According to such a construction, since a defective one of the memory cells is specified, it can be efficiently replaced by a spare memory cell in a redundancy relieving process corresponding to a process subsequent to the execution of this specifying test. Namely, since only the defective memory cell need can be replaced by the spare memory cell during the redundancy relieving process, unnecessary waste of the spare memory cell can be eliminated and the time necessary for its replacement can be greatly shortened.

A lot of time is normally required upon the redundancy relieving process. Therefore, since the shortening of the time by such a construction contributes to a reduction in cost, the shortening of a period up to the supply of products, etc., a very great effect can be expected in a semiconductor field. Further, since the test means can be realized by such a simple configuration where only address data indicative of defective portions will be stored, the test means is available at low cost.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Figure 1:
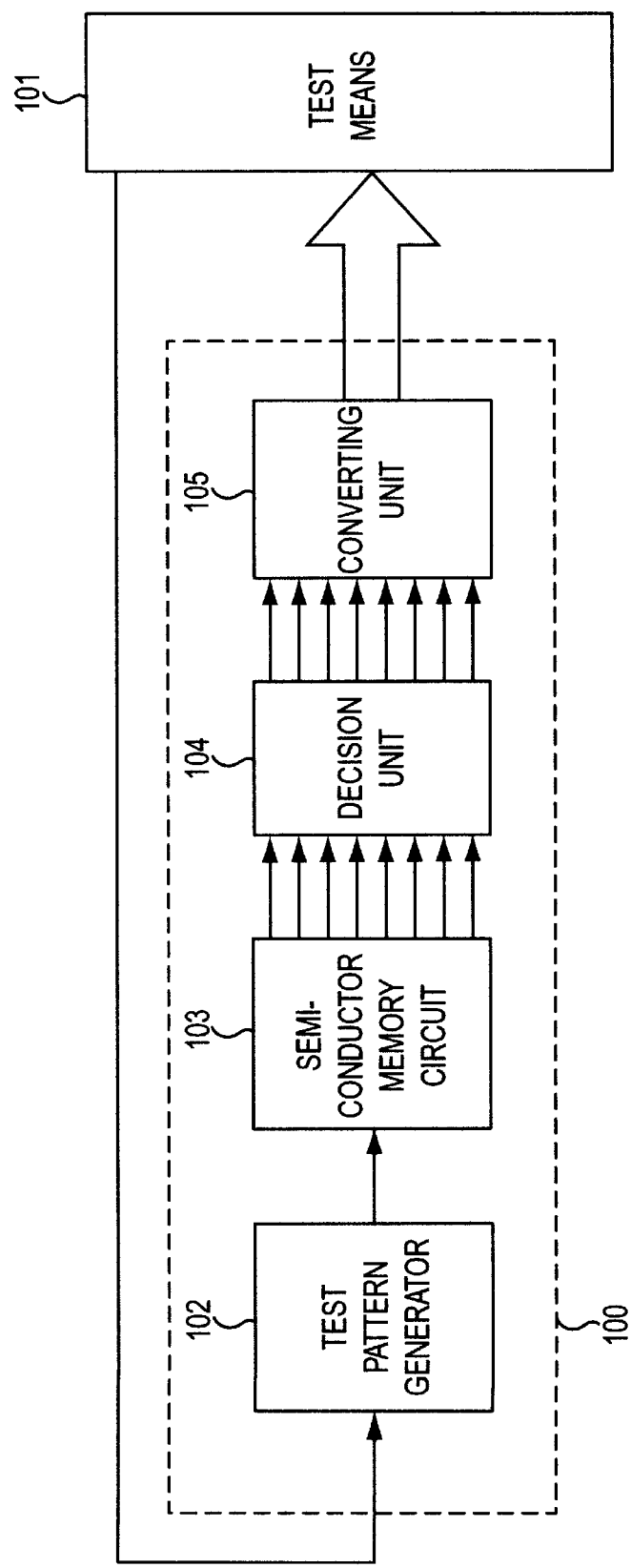
FIG. 1 is a circuit block diagram showing a first embodiment of the present invention.

Preferred embodiments of the invention according to the present application will hereinafter be described with reference to the accompanying drawings. Although typical portions are centrally described as embodiments in the description of various embodiments to be described later, portions whose descriptions are omitted or portions simplified in description will be easily understood if consideration is given to the descriptions of other embodiments. The accompanying drawings used for their description are schematically illustrated to help the understanding of the present invention. Elements of structure similar to one another, which are employed in the respective drawings, are identified by the same reference numerals and symbols and the description of certain common elements will be omitted whenever superfluous.

A first embodiment will first be described with reference to FIG. 1. Only a schematic view of the first embodiment of the present invention is illustrated in FIG. 1. Individual portions will be described in detail with regard to other embodiments to be explained later.

The semiconductor device 100 is tested for various test items by an externally-provided test means 101. As the test for the items, for example, a test on a decision as to whether the operation of the present semiconductor device 100 is good or bad or on determination or specification of a defective portion, is considered. Various tests are also considered in addition to this. However, the test items are suitably selected by a test executor. The following respective embodiments respectively show a case in which a semiconductor device has a semiconductor memory circuit and a test on the semiconductor memory circuit is executed. However, the present invention can be applied to tests for other various semiconductor integrated circuits.

The test means 101 has, for example, the function of generating a test start command corresponding to a command indicative of the initiation or start of a test and performing the final process in response to the result of its test.

The semiconductor device 100 comprises a test pattern generator 102 for generating a test pattern indicative of the type of test, a test command for the designation and control of an address (a control signal with respect to respective portions), and an expected value defined as the reference for comparison in a determination or decision unit, in response to the test start command sent from the test means 101, a semiconductor memory circuit 103 for performing a test on the holding of data therein and reading of it therefrom or writing of it thereto based on the test pattern and the test command, the decision unit 104 for performing a comparison between results outputted from the semiconductor memory circuit 103 for every column and the expected value and outputting the result of comparison therefrom, and a converting or translation unit 105 for converting the result of comparison outputted from the decision unit 104 into an address word and transferring it therefrom.

The operation of the semiconductor device 100 will next be described in brief. When the test start command is outputted from the test means 101, the test pattern generator 102 first generates a test pattern, a test command and an expected value all programmed in advance in response to the test start command. Thereafter, the test pattern generator 102 supplies the test pattern and the test command to the semiconductor memory circuit 103 and supplies the expected value to the decision unit 104. The semiconductor memory circuit 103, which has received the test pattern and the test command therein, performs a data write operation and thereafter reads data based on data stored in each memory cell defined in a desired row for each column. The data read out for each column is compared with the expected value by the decision unit 104. A decision as to whether each memory cell placed in the semiconductor memory circuit 103 is good or bad, can be realized from its comparison. Each result of comparison is supplied to the converting unit 105 from which an address word indicative of a portion in which a failure or defect has occurred, is generated based on the result of comparison and is thereafter outputted to the test means 101. The test means 101 stores the outputted address word therein. Since such an operation is effected on all the rows, address words indicative of all the failed portions in the semiconductor memory circuit 103 are stored in the test means 101.

Since each stored address word is used for specifying the faulty portion of each memory cell, the memory cell associated with the address word is efficiently replaced by a spare memory cell during the next redundancy relieving process. Namely, since only the defective memory cell will be replaced with the spare memory cell during the redundancy relieving process, needless waste of each spare memory cell can be avoided and the time required to replace the defective memory cell with the spare one can be greatly shortened.

A lot of time is normally required upon the redundancy relieving process. Therefore, since the shortening of the time by the construction of the present embodiment contributes to a reduction in cost, the shortening of a period up to the supply of products, etc., a very great effect can be expected in a semiconductor field. Further, since the test means can be realized by such a simple configuration where only the address data indicative of each defective portion are stored, the test means is available at low cost.

Figure 2:
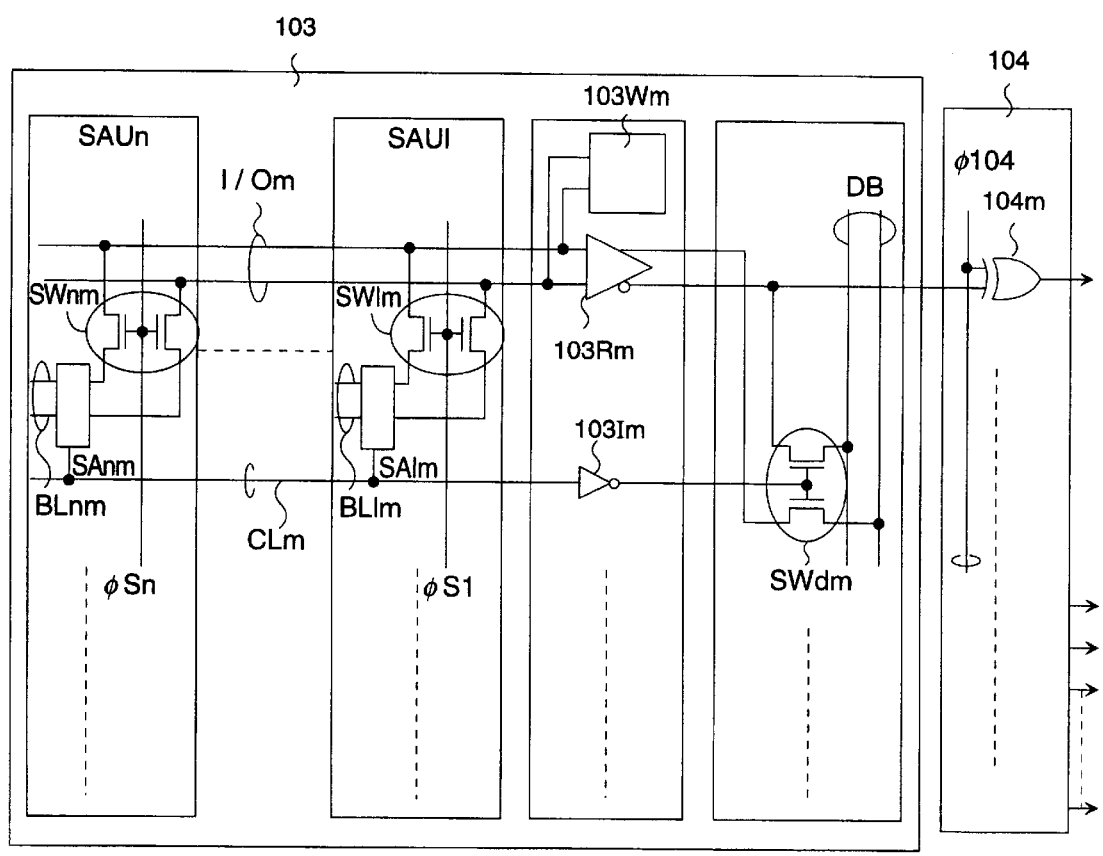
FIG. 2 is a partial circuit block diagram illustrating a second embodiment of the present invention.

A second embodiment will next be described with reference to FIG. 2. In the second embodiment, specific examples of configurations of the aforementioned semiconductor memory circuit 103 and decision unit 104 are illustrated. Since configurations for every column are similar to those employed in the above embodiment, the configuration of an arbitrary column m (m=1~m) of a plurality of columns is shown in FIG. 2.

The semiconductor memory circuit 103 comprises a plurality of sense amplifier units SAU1 through SAUn, input/output buses I/Om for respectively reading data from the sense amplifier units (called "data read operation") or writing it into the sense amplifier units (call "data write operation"), a data bus DB, read circuits 103Rm for respectively outputting data placed on the input/output buses I/Om to the data bus DB upon the data read operation and outputting the data placed on the input/output buses I/Om to the decision unit 104 upon a test operation of the semiconductor memory circuit, write circuits 103Wm for writing data into their corresponding sense amplifier units through the I/O buses upon the data write operation, and switch means SWdm (composed of N channel MOS transistors (hereinafter called "NMOSs")) each disposed between the read circuit 103Rm and the data bus DB.

The sense amplifier unit SAUn (n=1~n, n>m) consists of bit line pairs BLnm for respectively transferring data stored in memory cells, sense amplifiers SAnm for respectively amplifying data lying on the bit line pairs BLnm, and switch means SWnm disposed between the sense amplifiers SAnm and the I/O buses. Each switch means SWnm is controlled by a sense amplifier unit select signal φ sn. Each sense amplifier SAnm is controlled by a column signal φ CLm supplied to a column line CLm. In this case, when the column signal φ CLm is high in level, the sense amplifier SAnm is activated so as to perform an amplifying operation. This column signal is also supplied to the switch means SWdm through an inverter 103Im. In the present embodiment, the I/O bus is disposed so as to extend in the same direction as that of the column line.

The decision unit 104 is composed of a plurality of decision circuits 104m (m=1~m) (each decision circuit consists of an exclusive-OR circuit in this case). Each decision circuit 104m compares an output produced from the read circuit 103Rm with an expected value φ 104 outputted from the test pattern generator 102 and outputs the result of comparison therefrom.

The column signal φ CL and the sense amplifier unit select signal φ sn are generated based on decode signals supplied from unillustrated Y and X decoders or their corresponding decoders.

The operation of the configuration for the semiconductor memory circuit will next be described. However, since the read and write operations can be easily understood if the above-described configuration is taken into consideration with the operation of the commonly-used semiconductor memory circuit, the description of its operation at the test operation will be made here. The operation of the semiconductor memory circuit 103 is principally described herein. However, the understanding of the operation of the present circuit is made easy if reference is made even to the description of the operation of the first embodiment referred to above.

Upon the test operation, high-level column signals φ CL1 through φ CLm are first supplied to their corresponding column lines CL1 through CLm. Thus, the switch means SWd1 through SWdm are turned off and the sense amplifiers SA11 through SAnm are activated so that the data on the bit line pairs BL11 through BLnm are amplified. Thereafter, the switch means are turned on in order, for every sense amplifier unit (every row). Namely, the switch means SW11 through SW1m are first turned on in response to the sense amplifier unit select signal φ s1 so that the data amplified by the sense amplifiers are respectively supplied to the input/output buses I/O1 through I/Om. Thereafter, the data on the input/output buses I/O1 through I/Om are respectively supplied to the decision circuits 1041 through 104m through the read circuits 103R1 through 103Rm for every column. Afterwards, the decision circuits 1041 through 104m compare the respective data with the expected value f104 and output the results of comparisons therefrom, respectively. Similarly, the sense amplifier units SAU2 through SAUn are also activated so as to compare the respective data and the expected value f104.

Thus, since all the memory cells can be tested by simply selecting the respective rows in order in accordance with the sense amplifier unit select signals, defective portions can be specified in a short time and a simple test is allowed.

Figure 3:
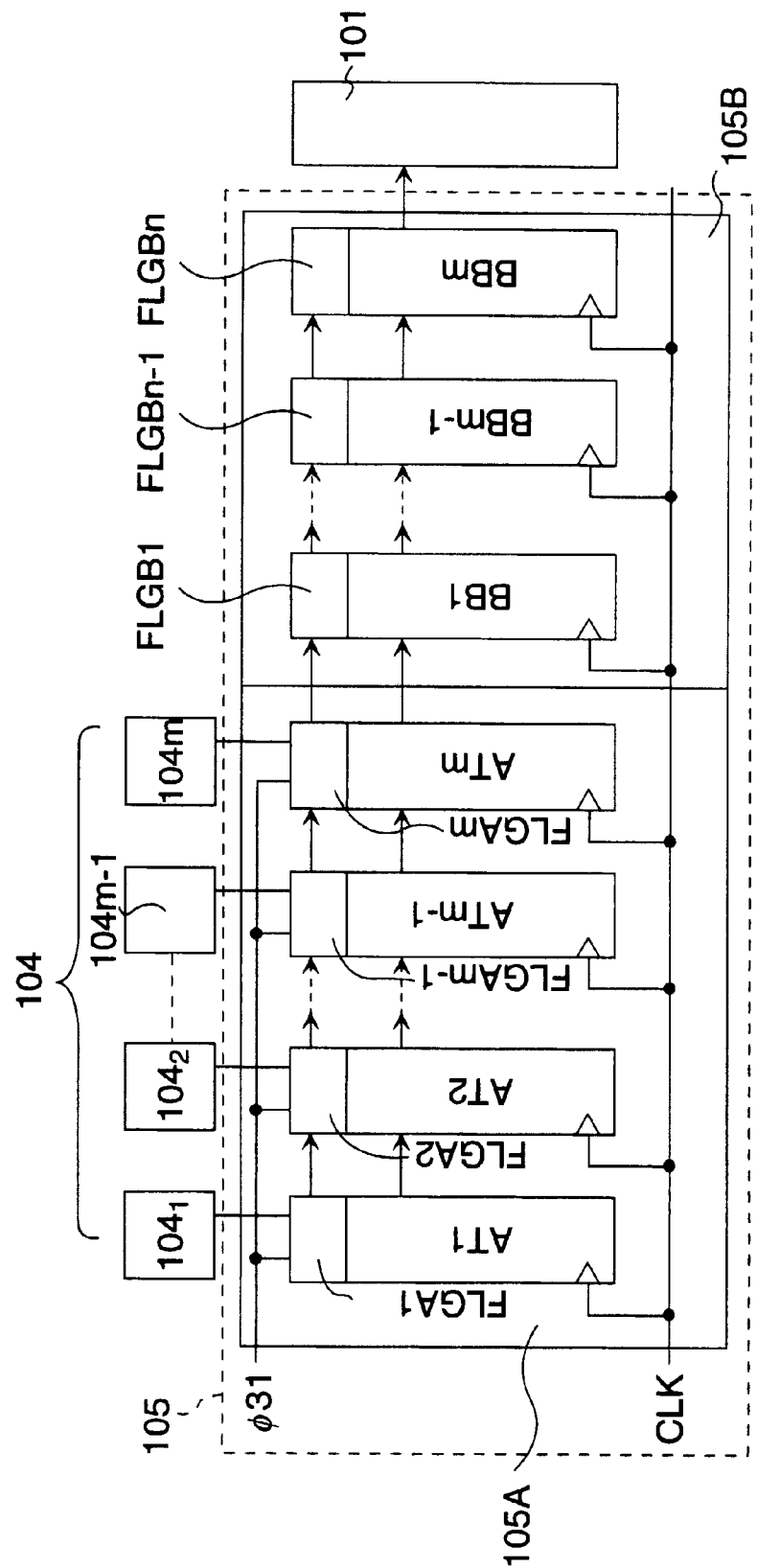
FIG. 3 is a partial circuit block diagram depicting a third embodiment of the present invention.
Figure 4:
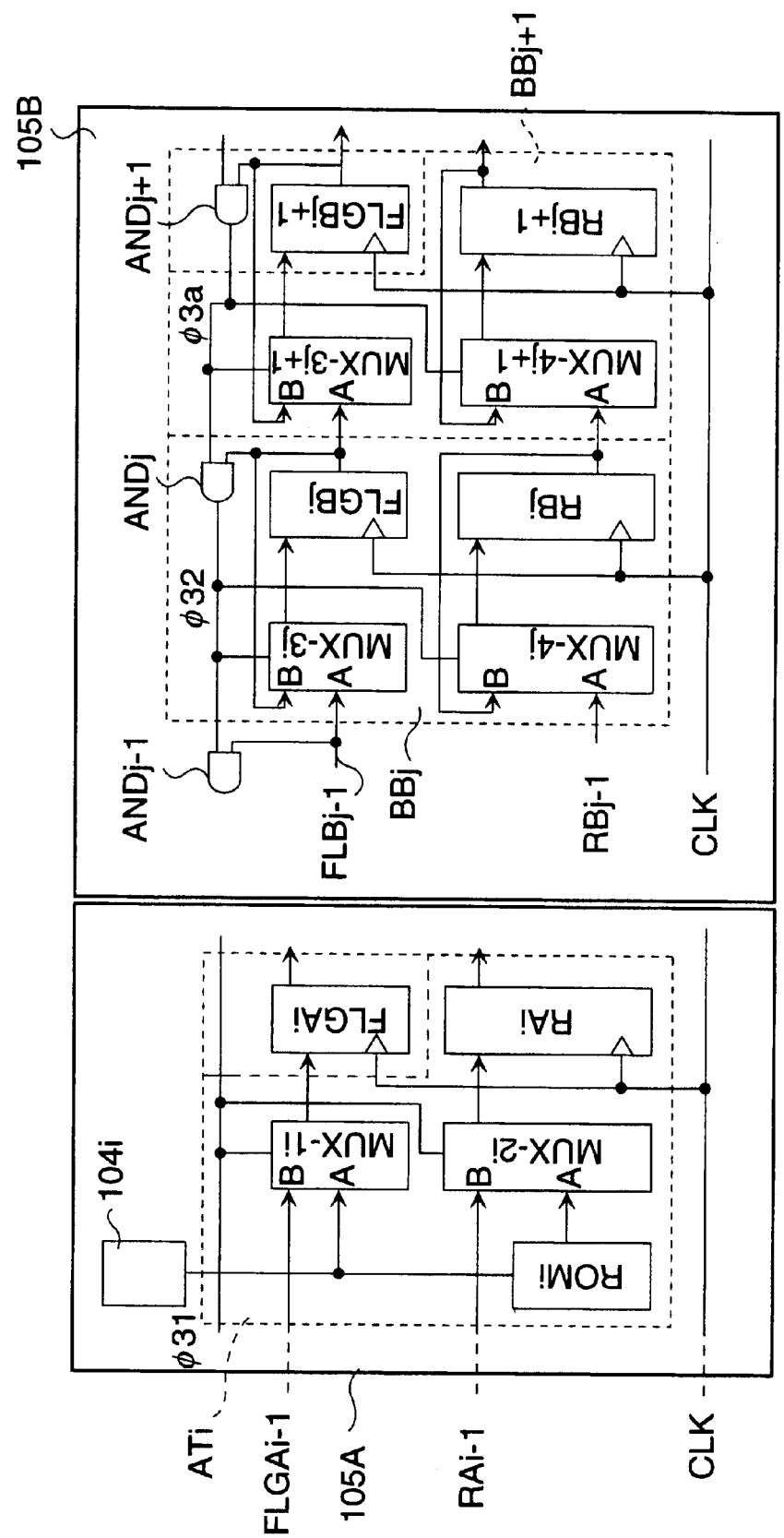
FIG. 4 is a partial circuit block diagram showing the third embodiment of the present invention in detail.

A third embodiment of the present invention will next be described with reference to FIGS. 3 and 4. FIG. 3 shows the configuration of the converting or translation unit 105. FIG. 4 is a diagram for describing the configuration of FIG. 3 in further detail.

The translation unit 105 comprises a m-column address translation circuit block 105A for converting the result (m bit) of decision from the decision unit 104, good or bad, into a bit address of a j bit ($2^j \geq m$), and an n-stage buffer circuit block 105B.

The address translation circuit block 105A is composed of flag circuits FLGA1 through FLGAm and translation circuits AT1 through ATm. The buffer circuit block 105B comprises flag circuits FLGB1 through FLGBn. The address translation circuit block 105A and buffer circuit block 105B of the converting unit 105 are activated in synchronism with a clock signal CLK.

When the result of decision outputted from the decision circuit 104i ($1 \leq i \leq m$) of the decision unit 104 shows the failure of data in the translation unit 105, the flag circuit FLGAi indicates a flag set to "1" and the translation circuit ATi corresponding to the flag circuit FLGAi creates an address word for designating or specifying a defective portion of data. Thereafter, the flag and the address word are successively shifted in synchronism with the clock signal so as to be stored in a buffer circuit BB. Afterwards, the addresses stored in the buffer circuit BB are continuously serially-transferred to the test means 101.

Further detailed configurations and operations of the translation unit 105 will be described below with reference to FIG. 4.

The address translation circuit ATi comprises a multiplexer circuit MUX-1i for receiving or inputting therein data supplied to either one of A and B terminals thereof in response to a control signal φ 31, a j-bit multiplexer circuit MUX-2i for inputting therein data supplied to either one of A and B terminals thereof in response to the control signal φ 31, a ROMi storing therein an address peculiar to each circuit block, and an address register RAi for holding a j-bit address therein.

The A terminal of the MUX-1i is supplied with the result of decision by the decision circuit 104i, which is indicative of whether data is good or defective or bad. When the result of decision is found to be "defective or bad", the flag circuit FLGAi outputs a signal for providing instructions for indicating the flag as "1". When the result of decision is found to be "good", the flag circuit FLGAi outputs a signal for providing instructions for indicating the flag as "0". Further, an output sent from the preceding-stage flag circuit FLGAi-1 is supplied to the B terminal of the MUX-1i and an output terminal of the MUX-1i is electrically connected to an input of the flag circuit FLGAi. An input terminal of the ROMi is supplied with the result of decision by the decision circuit 104i, which is indicative of whether data is good or bad. When the result of decision is found to be "bad", the ROMi outputs a j-bit address therefrom. On the other hand, when the result of decision indicates "good", no output is produced from the ROMi and an output terminal of the ROMi is electrically connected to the A terminal of the multiplexer circuit MUX-2i. The A terminal of the MUX-2i is electrically connected to the output terminal of the ROMi and the B terminal of the MUX-2i is electrically connected to an output terminal of a precedingstage address register RAi-1. An output terminal of the MUX-2i is electrically connected to an input terminal of the address register RAi. The flag circuit FLGAi and the address register RAi are activated in synchronism with the clock signal CLK.

The buffer circuit BBj comprises a MUX-3j for receiving or inputting therein data supplied to either one of A and B terminals thereof in response to a control signal φ 32, a j-bit multiplexer circuit MUX-4j for inputting therein data supplied to either one of A and B terminals thereof in response to the control signal φ 32, and an address register RBj for holding a j-bit address therein.

The A terminal of the MUX-3j is electrically connected to an output terminal of a preceding-stage flag circuit FLBj-1. The B terminal of the MUX-3j is electrically connected to an output terminal of a flag circuit FLGBj corresponding to the next stage. Further, an output terminal of the MUX-3j is electrically connected to an input terminal of the flag circuit FLGBj. The A terminal of the MUX-4j is electrically connected to an output terminal of a preceding-stage address register RBj-1 and the B terminal thereof is electrically connected to an output terminal of an address register RBj corresponding to the next stage. Further, an output terminal of the MUX-4j is electrically connected to an input terminal of the address register RBj. The output terminal of the address register RBj is electrically connected to an input terminal of a multiplexer circuit MUX-4j+1 corresponding to the next stage. The output terminal of the flag circuit FLGBj is electrically connected to the B terminal of the multiplexer circuit MUX-3j, one input terminal of a gate circuit ANDj (corresponding to an AND circuit in the present embodiment) and an A terminal of a multiplexer circuit MUX-3j+1 corresponding to the next stage. The other input terminal of the gate circuit ANDj is electrically connected to an output terminal of the next-stage gate circuit ANDj+1. However, an output produced from a flag circuit FLGBn is used as it is as the control signal φ 32 at the final stage corresponding to an nth stage. Further, respective A terminals of first-stage multiplexer circuits MUX-3l and MUX-4l are respectively supplied with an output produced from a flag circuit FLGAm and an address register RAn corresponding to the final stages of the translation circuit block 105A. The flag circuit FLGBJ and the address register RBj are activated in synchronism with the clock signal CLK.

The operation of the present embodiment will next be described. The description of the operations of the above-described first and second embodiments will be taken into consideration to provide further understanding of its operation.

When the control signal φ 31 is rendered high in level, data supplied to the A terminals of the multiplexer circuits MUX-1i and MUX-2i are first inputted to the multiplexer circuits MUX-1i and MUX-2i.

When the result of decision by the decision circuit 104i is found to be [bad] in this case, the multiplexer circuit MUX-1i outputs a signal for providing instructions for indicating a flag as "1". The multiplexer circuit MUX-2i inputs an inherent j-bit address from the ROMi and supplies the address to the address register RAi.

On the other hand, when the result of decision by the decision circuit 104i is found to be "good", the multiplexer circuit MUX-1i allows the flag circuit FLGAi-1 to output a signal for providing instructions for indicating the flag as "0". Since the multiplexer circuit MUX-2i is not supplied with the address from the ROMi, the address register RAi is maintained at the initial state.

Next, when the control signal φ 31 is rendered low in level, data supplied to the B terminals of the multiplexer circuit MUX-1i and MUX-2i are inputted to the multiplexer circuits MUX-1i and MUX-2i. In this case, the B terminal of the multiplexer MUX-1i is supplied with the flag of the preceding-stage flag circuit FLGAi-1 in synchronism with the clock signal CLK. Thus, the multiplexer circuit MUX-1i causes the next-stage flag circuit FLGAi to output a signal for providing instructions for indicating the flag as "1" or "0" according to the flag. Similarly, the output produced from the flag circuit FLGAi is supplied to a B terminal of a multiplexer circuit MUX-1i+1 corresponding to the next stage. The B terminal of the multiplexer circuit MUX-2i is supplied with the address stored in the preceding-stage address register RAi-1 in synchronism with the clock signal CLK and thereafter the multiplexer circuit MUX-2i supplies the address to the next-stage address register RAi. Similarly, the output of the address register RAi is supplied to a B terminal of a multiplexer circuit MUX-2i+1 corresponding to the next stage.

Similarly, information about the flag and address information corresponding to the flag are subsequently successively shifted in synchronism with the clock signal CLK (for each clock).

Next, the so-shifted information are supplied to the buffer circuit block 105B so as to successively shift buffer circuits BB1 through BBn corresponding to n stages provided within the buffer circuit block 105B. This operation will now be described.

Since the control signal φ 32 is low in level when the buffer circuits BB1 through BBn corresponding to the n stages are placed in their initial states, data supplied to A terminals of multiplexer circuits MUX-31 through MUX-3n and MUX-41 through MUX-4n are inputted.

Even in this case, in a manner similar to the example of the shifting of the data by the aforementioned address translation circuit block, a flag supplied from the flag circuit FLGAm and an address supplied from the address register RAn are shifted stage by stage for each clock in synchronism with the clock signal CLK after they have been supplied to the A terminals of the multiplexer circuits MUX-31 and MUX-41 respectively.

When information (i.e., information indicative of bad or defective data) indicative of the flag "1" is thereafter input to the final-stage flag circuit FLGBn, the output (corresponding to the control signal $\phi$ 32) of the flag circuit FLGBn becomes high in level, so that B terminals of the final-stage multiplexer circuits MUX-3n and MUX-4n are selected. Therefore, the multiplexer circuits MUX-3n and MUX-4n do not receive outputs produced from a flag circuit FLGBn−1 and an address register RBn−1, both corresponding to preceding stages. As a result, the flag "1" indicative of "failure or defect" and an address corresponding to its defective or bad portion are respectively stored in the final-stage flag circuit FLGBn and address register RBn. Similarly, when the information (i.e., information indicative of "defective or bad data") indicative of the flag "1" is inputted to the n−1th-stage flag circuit FLGBn−1, a gate circuit ANDn outputs a high-level control signal $\phi$ 32 in response to the outputs produced from the flag circuit FLGBn−1 and the final-stage flag circuit FLGBn so that B terminals of a multiplexer circuit MUX-3n−1 and a multiplexer circuit MUX-4n−1 both corresponding to n−1th stages are selected. Thus, the multiplexer circuit MUX-3n−1 and MUX-4n−1 do not receive outputs produced from a flag circuit FLGBn−2 and an address register RBn−2 both corresponding to preceding stages. As a result, a flag "1" indicative of a second failure or defect and an address corresponding to its defective portion are respectively stored in the n−1th-stage flag circuit FLGBn−1 and address register RBn−1.

By repeating such operations, the data produced from the m-stage type translation circuit block 105A are all shifted to the buffer circuit block 105B in response to the m clock signals CLK. The data produced from the m-stage type translation circuit block 105A are respectively associated with the m-stage decision circuits 104. Namely, since the data produced therefrom respectively correspond to the m columns of the semiconductor memory circuit 103, all the addresses each indicative of a memory cell in which a failure has occurred, are stored in their corresponding buffer circuits by a series of these operations.

Thereafter, all the addresses stored in the buffer circuit block 105B are continuously serially-outputted to the test means 101.

According to such a construction as described above, only the addresses indicative of the memory cells in which the failures have occurred, are specified and successively outputted to the test means. It is therefore possible to greatly shorten a test time interval necessary for the subsequent redundancy relieving process. Further, since the test means can be realized by such a simple structure where only address data indicative of defective portions are stored, the test means is available at low cost.

Figure 5:
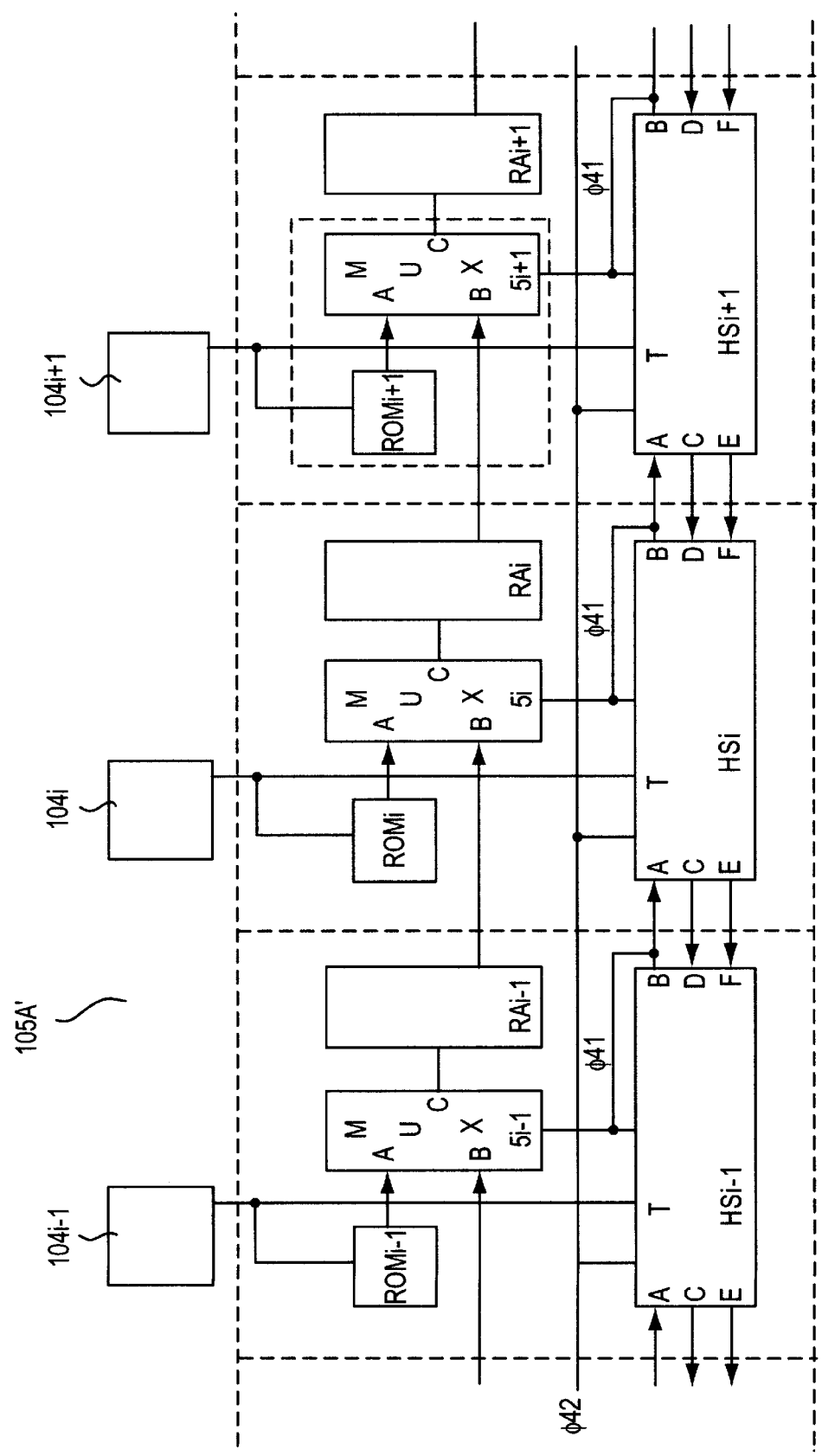
FIG. 5 is a partial circuit block diagram illustrating a fourth embodiment of the present invention.
Figure 6:
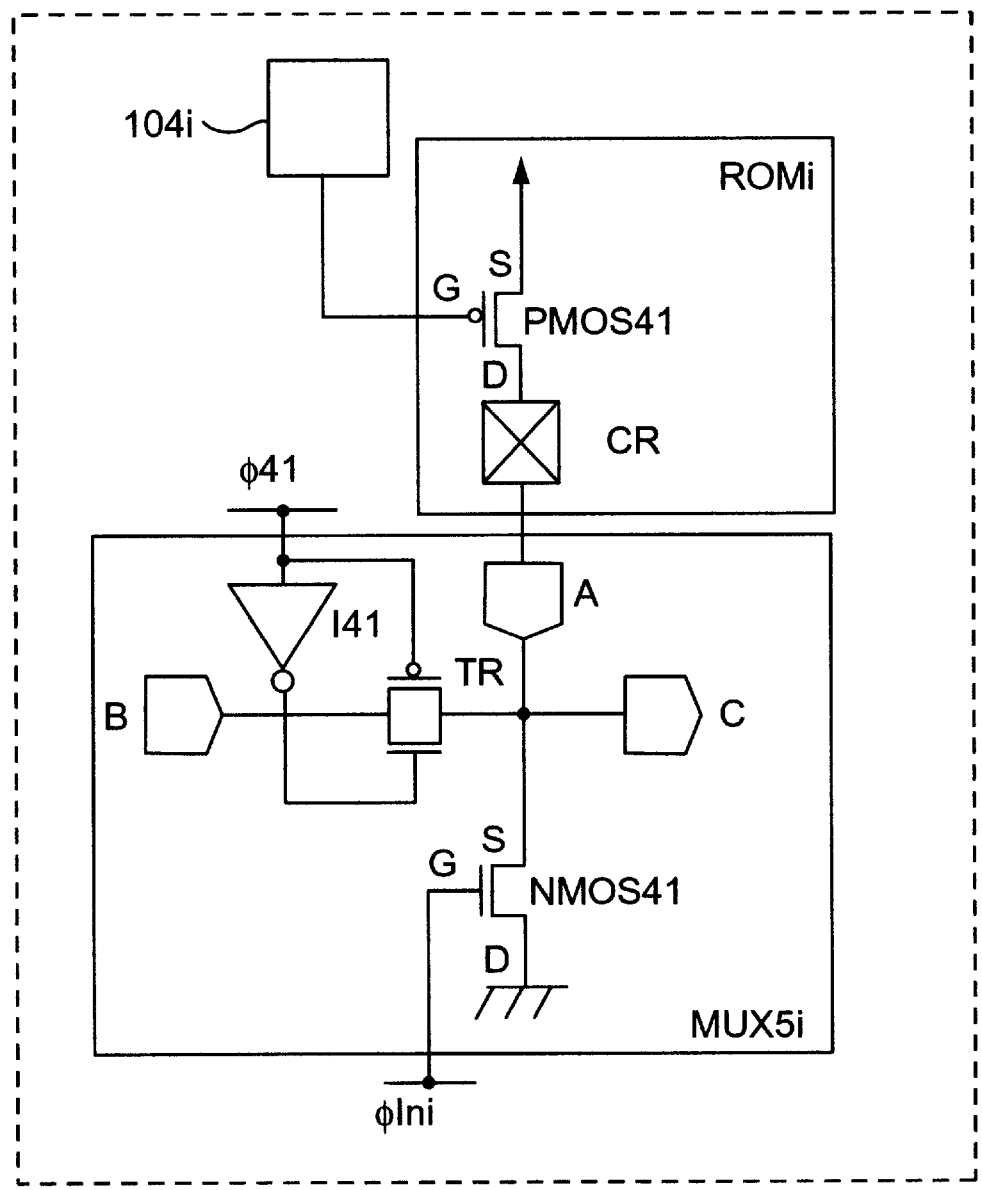
FIG. 6 is a circuit block diagram depicting a partial configuration of the fourth embodiment in detail.
Figure 7:
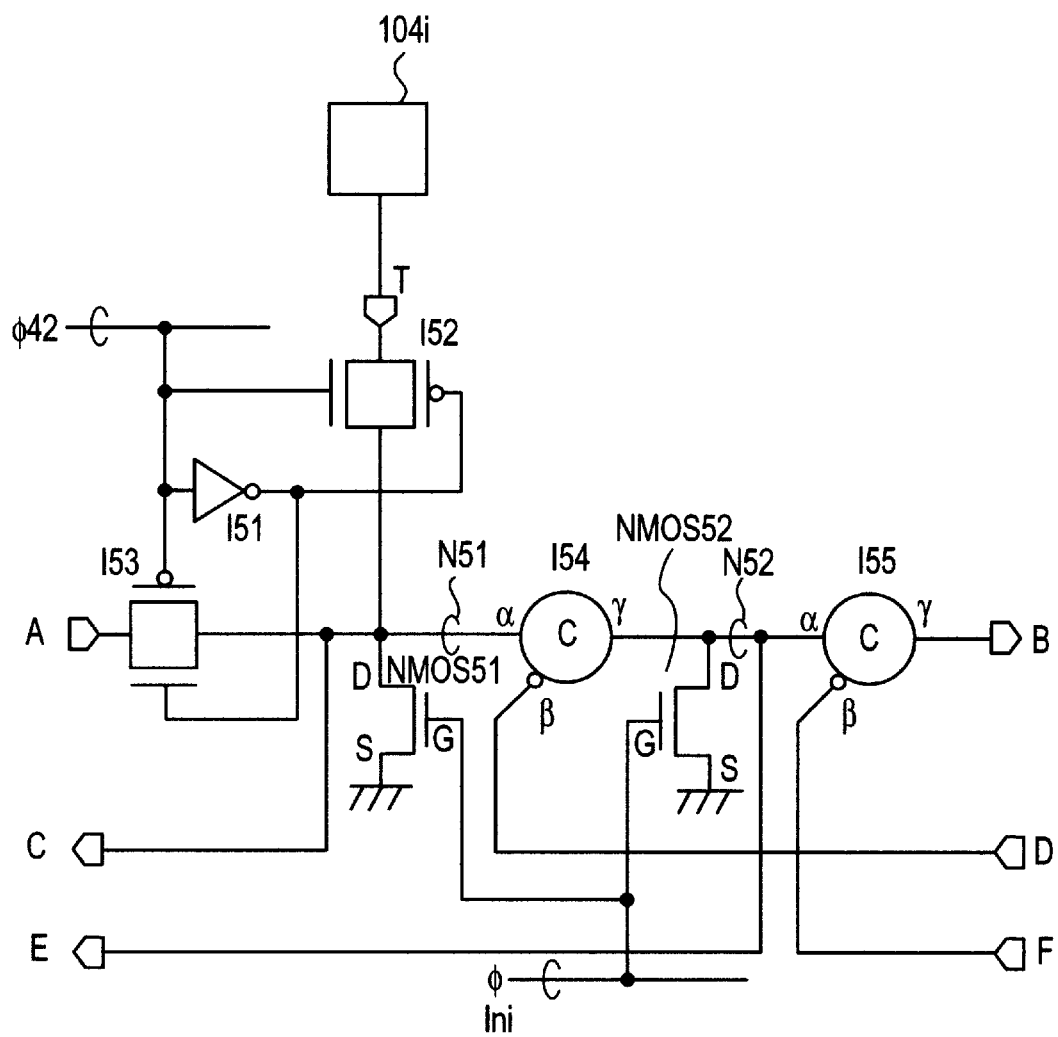
FIG. 7 is a circuit block diagram showing a fifth embodiment of the present invention.

A fourth embodiment of the present invention will next be described with reference to FIGS. 5 and 6. FIG. 5 is a diagram showing a translation circuit block 105A' corresponding to another configurational example of the translation circuit block 105A. FIG. 6 is a diagram showing the configuration of FIG. 5 in further detail. The description of the above-described third embodiment will be used for reference purposes to understand the following description.

The translation circuit block 105A' basically has the same function as that of the aforementioned translation circuit block 105A. Each of translation circuits AT'i that constitute the translation circuit block 105A', will be described below.

The address translation circuit AT'i comprises a j-bit multiplexer circuit MUX-5i for inputting therein data supplied to either one of A and B terminals in response to a control signal $\phi$ 41 and outputting data from an output terminal C, a ROMi for storing an address peculiar to the circuit block, an address register RAi for holding a j-bit address therein, and a handshake control circuit HSi for selecting, in response to a control signal $\phi$ 42, a running state for transferring an input state in which the result of decision by a determination or decision circuit 104i can be input thereto, or data stored therein to an address translation circuit AT'i+1 corresponding to the following stage.

An input terminal of the ROMi is supplied with the result of decision, by the decision circuit 104i, which is indicative of whether data is good or bad, and an output terminal thereof is electrically connected to an A terminal of the multiplexer circuit MUX-5i.

A B terminal of the MUX-5i is supplied with an output produced from a preceding-stage address register RAi−1 and an output terminal thereof is electrically connected to an input terminal of the next-stage address register RAi.

An input terminal T of the handshake control circuit HSi is supplied with the result of decision by the decision circuit 104i, which is indicative of whether data is good or bad. Further, an input terminal A of the handshake control circuit HSi is electrically connected to an output terminal B of a preceding-stage handshake control circuit HSi−1 (an output terminal B of the handshake control circuit HSi is electrically connected to an input terminal A of a handshake control circuit HSi+1 corresponding to the following stage). An output terminal C of the handshake control circuit HSi is electrically connected to an input terminal D of the handshake control circuit HSi−1 (an input terminal D of the handshake control circuit HSi is electrically connected to an output terminal C of the handshake control circuit HSi+1). An output terminal E of the handshake control circuit HSi is electrically connected to an input terminal F of the handshake control circuit HSi−1 (an input terminal F of the handshake control circuit HSi is electrically connected to an output terminal E of the handshake control circuit HSi+1). Moreover, the output terminal B of the handshake control circuit HSi is electrically connected to the multiplexer circuit MUX-5i and an output produced is supplied to the multiplexer circuit MUX-5i as a control signal $\phi$ 41. This handshake control circuit HS has the function of detecting the state of the following-stage handshake control circuit HS and determining, according to the result of detection, whether the information stored in the following stage should be transferred.

A specific configuration of connection between the multiplexer circuit MUX-5i and the ROMi is shown in FIG. 6.

The ROMi comprises a contact ROM CR electrically connected to the A terminal of the multiplexer circuit MUX-5i for providing either connection or nonconnection according to the presence or absence of contact, and a P channel MOS transistor (hereinafter "PMOS") 41 whose drain, source and gate electrodes are respectively electrically connected to the contact ROM CR, a source potential Vcc and the output of the decision circuit 104i.

The multiplexer circuit MUX-5i comprises an A terminal electrically connected to the contact ROM CR, a transfer circuit electrically connected between a B terminal and a C terminal that is composed of an N channel MOS transistor (hereinafter "NMOS") whose gate electrode is supplied with a control signal $\phi$ 41 through an inverter I41 and a PMOS whose gate electrode is supplied with the control signal $\phi$ 41, and an NMOS 41 electrically connected between the A terminal and a ground potential GND. A gate electrode of the NMOS 41 is supplied with an initialization signal $\phi$ Ini.

The operation of the above-described circuit will next be described.

When the control signal φ 42 becomes high in level, the handshake control circuit HSi first enters an input mode and outputs the control signal φ 41 from the output terminal B. Thus, the A terminal of the multiplexer circuit MUX-5i is selected according to the control signal φ 41. When the result of decision by the decision circuit 104i indicates "failure or defect", the j-bit address stored in the ROMi is read out and supplied to the A terminal of the multiplexer circuit MUX-5i. Since the A terminal of the multiplexer circuit MUX-5i is selected by the control signal φ 41, the address supplied to the A terminal is outputted from the C terminal so as to be stored in the address register RAi. When the result of decision by the decision circuit 104i is found to be "defective", information "1" is written into the handshake control circuit HSi.

On the other hand, when the result of decision by the decision circuit 104i is indicated as "good", all the addresses from the ROMi are brought to "0", so that information "0" is written into the handshake control circuit HSi.

Next, when the control signal φ 42 is rendered low in level, the handshake control circuit HSi is brought to a running mode. When the running mode is reached, the control signal φ 41 outputted from the output terminal B of the handshake control circuit HSi into which the information "0" has been written, is transitioned or changed to a low level. Thus, the B terminal of the multiplexer MUX-5i is selected in response to the transition of the control signal φ 41 to the low level. Thereafter, the multiplexer circuit MUX-5i receives the address stored in the preceding-stage address register RAi-1. The received address is stored in the next-stage address register RAi. Simultaneously, the handshake control circuit HSi receives therein information written into the preceding-stage handshake control circuit HSi-1.

When the information "0" is written into the following-stage handshake control circuit HSi+1 and the information "1" is written into the handshake control circuit HSi in this case, the data are outputted from the address register RAi and the handshake control circuit HSi and thereafter the control signal φ 41 becomes low in level and the address register RAi is supplied with the output of the preceding-stage address register RAi-1. Further, the next-stage handshake control circuit HSi receives therein the information which has been written into the preceding-stage handshake control circuit HSi-1.

When the information "1" is written into the handshake control circuits from the final-stage handshake control circuit HSm of the mth-stage translation circuit block 105A' to the handshake control circuit HSi, the control signal φ 41 remains held at a high level and the input of each address and information from the preceding stage cannot be accepted.

Owing to such an operation, only a plurality of addresses associated with portions in which failures have occurred, are successively stored from the address register RAm corresponding to the final-stage handshake control circuit HSm.

Thereafter, address data indicative of defective portions are sequentially serially-outputted to the test means 101 in a manner similar to the third embodiment referred to above.

According to the present embodiment, the following advantageous effect can be obtained in addition to the effect obtained by the third embodiment. Namely, since the handshake control circuit can be activated by detecting the state of the next-stage handshake control circuit, the handshake control circuit can transfer the address data independently of the clock signals without waiting for the m clock signals. Thus, the present embodiment can provide a high-speed operation.

A fifth embodiment of the present invention will next be described with reference to FIGS. 7 through 12. In the present embodiment, a specific configurational example of the handshake control circuit employed in the above-described fourth embodiment is illustrated.

Figure 8:
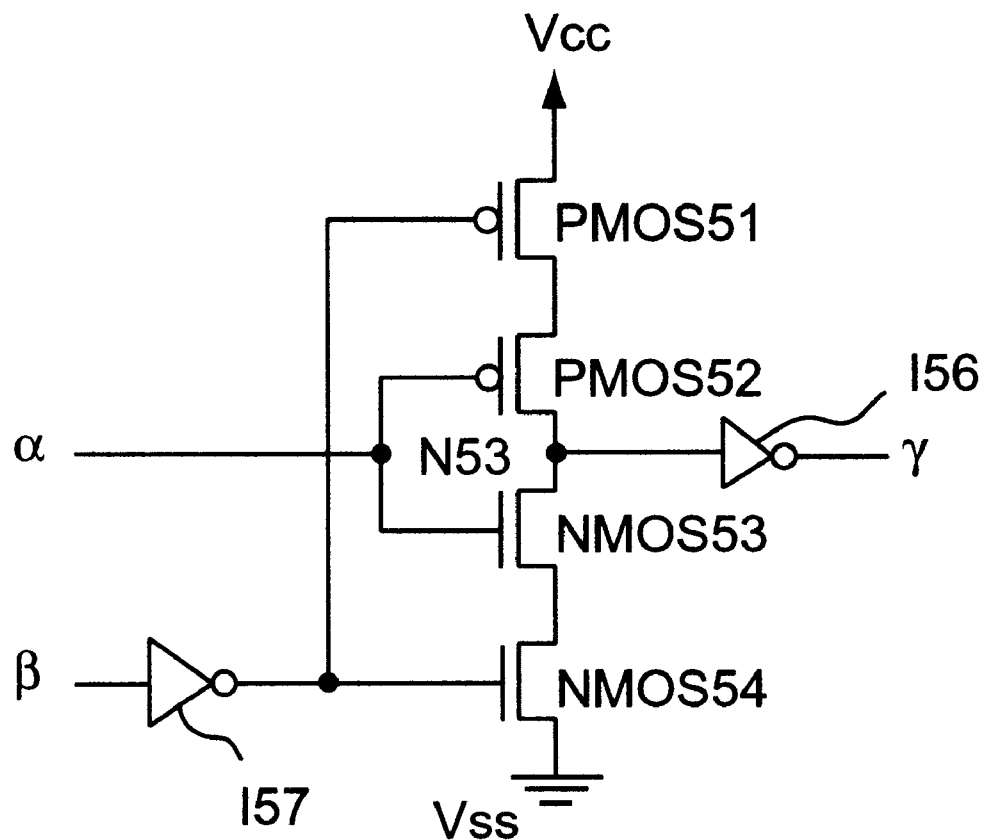
FIG. 8 is a circuit diagram illustrating a C element circuit employed in the fifth embodiment.

The handshake control circuit comprises an inverter I51 whose input is supplied with a control signal φ 42, a transfer gate circuit I52 which is electrically connected between an input terminal T electrically connected to a decision circuit 104i and a node N51 and which is composed of an NMOS whose gate electrode is supplied with the control signal φ 42 and a PMOS whose gate electrode is electrically connected to the output of the inverter I51, a transfer gate circuit I53 electrically connected between an input terminal A and the node N51 and composed of an NMOS whose gate electrode is electrically connected to the output of the inverter I51 and a PMOS whose gate electrode is supplied with the control signal φ 42, an NMOS 51 whose drain and source electrodes are respectively electrically connected to the node N51 and a ground potential Vss and whose gate electrode is supplied with an initialization signal φ Ini, a C element circuit I54 (whose specific circuit is shown in FIG. 8) whose α, β and γ terminals are respectively electrically connected to the node N51, an input terminal D and a node N52, a C element circuit I55 (whose specific circuit is illustrated in FIG. 8) whose α, β and γ terminals are respectively electrically connected to the node N52, an input terminal F and an output terminal B, an NMOS 52 whose drain and source electrodes are respectively electrically connected to the node N52 and the ground potential Vss and whose gate electrode is supplied with the initialization signal φ Ini, an output terminal C electrically connected to the node N51, and an output terminal E electrically connected to the node N52.

The input terminal A is electrically connected to an output terminal B of a preceding-stage handshake control circuit. An input terminal D is electrically connected to the output terminal C of the following-stage handshake control circuit, and an input terminal F is electrically connected to the output terminal E of the next-stage handshake control circuit.

As shown in FIG. 8, each of the C element circuits I54 and I55 has PMOSs 51 and 52 electrically series-connected between a source potential Vcc and a node N53, NMOSs 53 and 54 electrically series-connected between the node N53 and a ground potential Vss, an inverter I56 electrically connected between the node N53 and a γ terminal, and an inverter I57 electrically connected between gate electrodes of the PMOS 51 and the NMOS 54 and a β terminal. An α terminal is electrically connected to gate electrodes of the PMOS 52 and the NMOS 53.

The operation of the handshake control circuit will next be described.

When the initialization signal φ Ini becomes high in level, the nodes N51 and N52 are first brought to the ground potential level Vss. When the handshake control circuit enters an input mode and the control signal φ 42 becomes high in level, the transfer gate circuit I52 is turned on and the transfer gate circuit I53 is turned off. In doing so, the result of decision by the decision circuit 104i, which is indicative of whether data is good or bad, appears at the node N51.

When the handshake control circuit thereafter enters a running mode and the control signal φ 42 is rendered low in level, the transfer gate circuit I52 is turned off and the transfer gate circuit I53 is turned on.

Now, when the result of decision indicative of "failure", i.e., data "1" (high level) appears at the node N51 of the next stage and the result of decision indicated as "satisfactory", i.e., data "0" (low level) appears at the node N51 of the next stage, the input terminal D of the next stage is low in level upon the input mode. Therefore, the NMOS 54 and the NMOS 53 of the C element circuit I54 are turned on so that the node N52 is brought to the high level. Namely, the data "1" indicative of the result of decision, which has appeared at the node N51, is transferred or shifted to the node N52.

Further, since the node N52 of the next stage is low in level, the C element circuit I55 of the next stage is also activated in the same manner as described above so that the data "1" at the node N52 is shifted to the output terminal B.

Since the data "1" is shifted to the node N51 of the next stage when the handshake control circuit is in the running mode, the input terminal D of the next stage becomes high in level. As a result, the NMOS 54 of the C element circuit I54 is turned off. When the data supplied from the output terminal B at the preceding stage is "0" at this time, the node N51 of the next stage becomes the low level indicative of the data "0". On the other hand, when the data supplied from the output terminal B of the preceding stage is "1", the node N51 of the next stage becomes the high level indicative of the data "1".

When the node N51 of the next stage is at the low level indicative of the data "0", the output terminal D of the next stage becomes high in level so that the node N52 of the next stage is brought to the low level indicative of the data "0". When the node N51 of the next stage is at the high level indicative of the data "1", the node N52 of the next stage is brought to the low level indicative of the data "0" before the output terminal D of the following stage becomes high in level.

Further, since the NMOS 54 of the preceding-stage C element circuit I54 is also turned off when the node N51 of the next stage is at the low level indicative of the data "1", the node N51 of the next stage holds the data "1". When the node N51 of the next stage is brought to the low level indicative of the data "0", the data "1" at the next stage begins to shift.

By repeating such operations, only the results of decisions each indicative of the data "1" are stored in order from the final stage.

According to the handshake control circuit employed in the present embodiment, since the handshake control circuits detect the state of the following-stage handshake control circuit and transfers data therefrom, it can collect the data at high speed when the results of decisions indicative of the data "1" (i.e., the results of decisions each indicative of "failure") are reduced in number. Although the handshake control circuit is used for the transfer of each address at high speed in the present embodiment, it may be applied to the compression or the like of image data.

Figure 9:
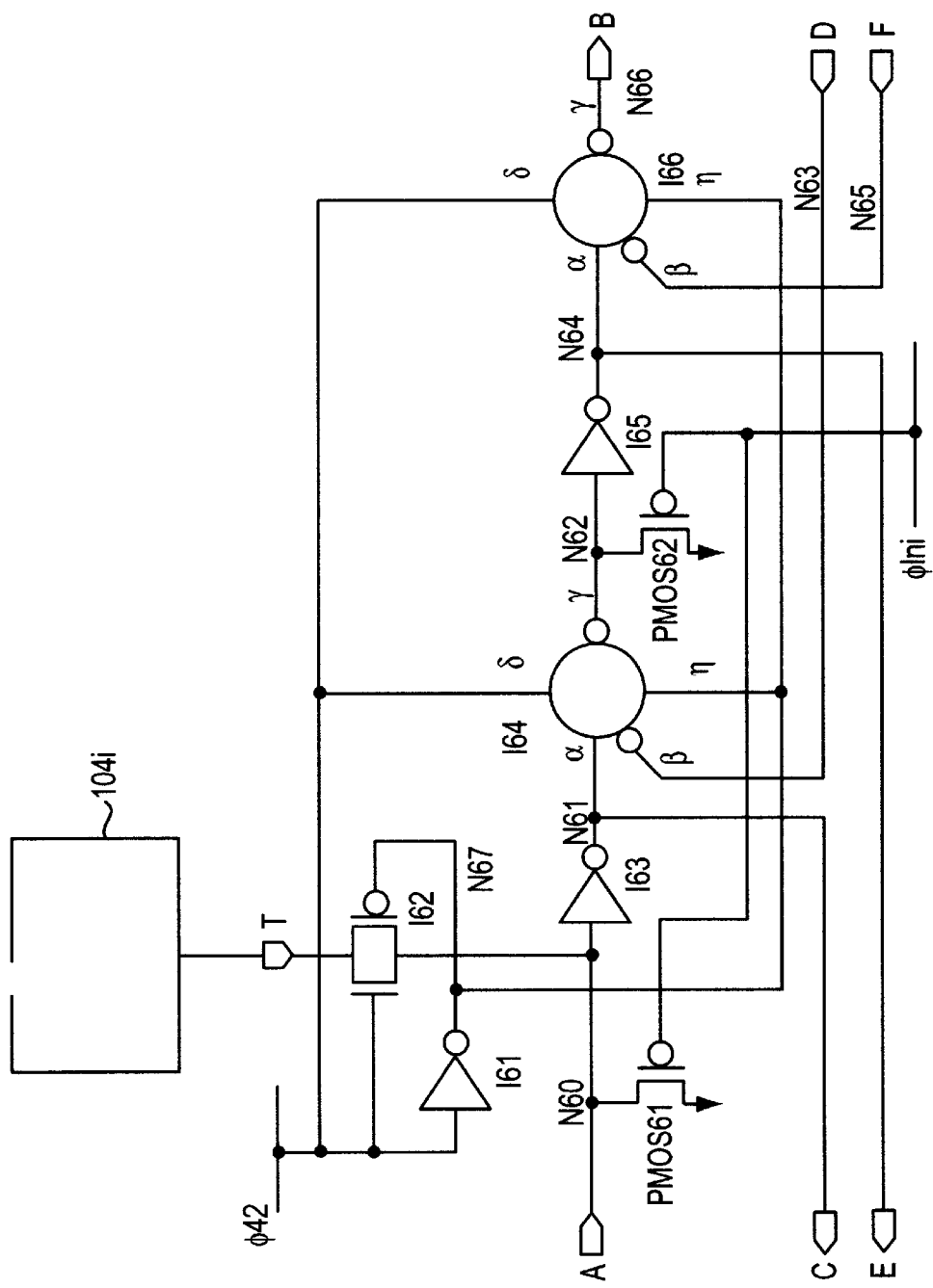
FIG. 9 is a circuit block diagram depicting another modification of the fifth embodiment.

Another example of the handshake control circuit will next be described with reference to FIGS. 9 and 10.

Figure 10:
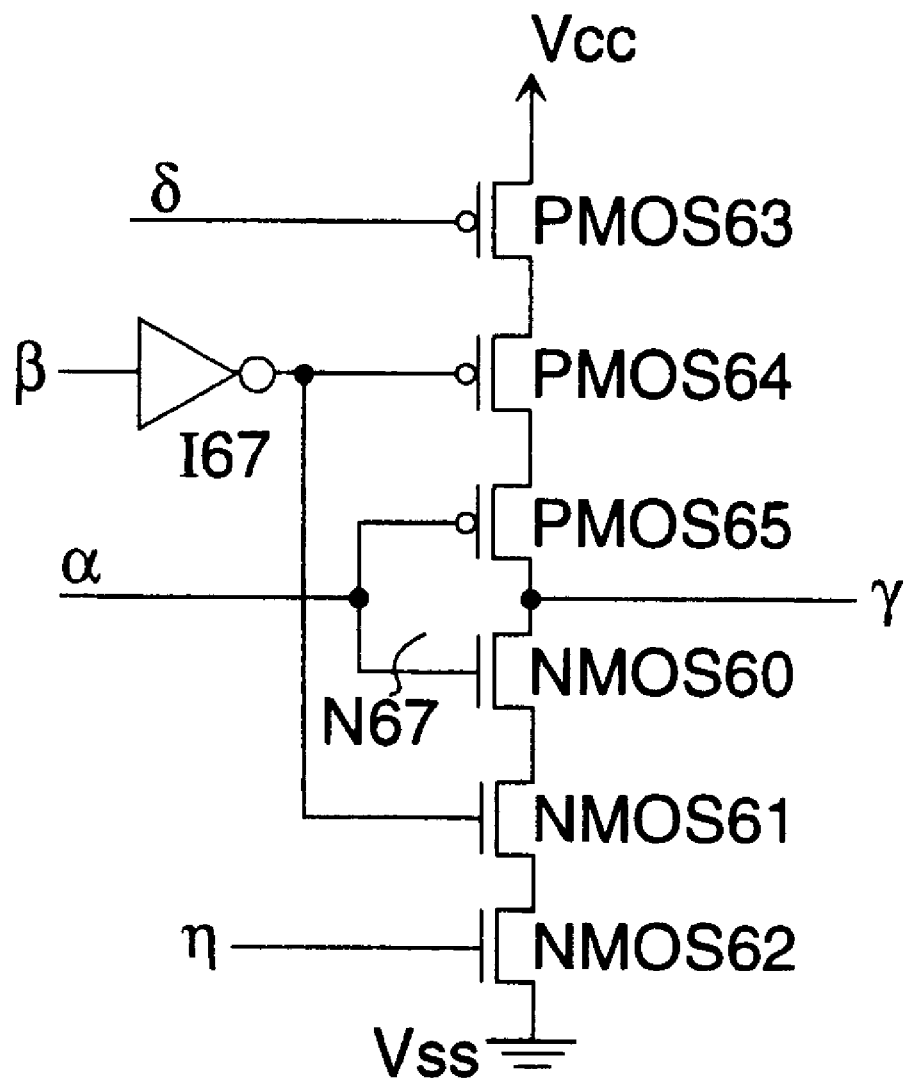
FIG. 10 is a circuit diagram showing a C element circuit employed in the modification shown in FIG. 9.

This type of handshake control circuit comprises an inverter I61 whose input is supplied with a control signal φ 42, a transfer gate circuit I62 electrically connected between an input terminal T electrically connected to a decision circuit 104$i$ and a node N60 (input terminal A) and composed of an NMOS whose gate electrode is supplied with the control signal φ 42 and a PMOS whose gate electrode is electrically connected to the output of the inverter I61, a PMOS 61 whose drain and source electrodes are respectively electrically connected to the node N60 and a source potential Vcc and whose gate electrode is supplied with an initialization signal φ Ini, an inverter I63 whose input and output are respectively electrically connected to the node N60 and a node N61, a C element circuit I64 (whose specific circuit is shown in FIG. 10) whose α, β and γ terminals are respectively electrically connected to the node 61, a node N63 (input terminal D) and a node N62, whose δ terminal is supplied with the control signal φ 42 and whose η terminal is electrically connected to a node N67, an inverter I65 whose input and output are respectively electrically connected to the node N62 and a node N64, a C element circuit I66 (whose specific circuit is illustrated in FIG. 10) whose a, b and g terminals are respectively electrically connected to the node N64, a node N65 (input terminal F) and a node N66 (output terminal B), whose s terminal is supplied with the control signal φ 42 and whose h terminal is electrically connected to the node N67, and a PMOS 62 whose drain and source electrodes are respectively electrically connected to the node 62 and the source potential Vcc and whose gate electrode is supplied with the initialization signal φ Ini.

The input terminal A is electrically connected to an output terminal B of a preceding-stage handshake control circuit. An input terminal D is electrically connected to the output terminal C of the following-stage handshake control circuit, and an input terminal F is electrically connected to the output terminal E of the next-stage handshake control circuit.

As shown in FIG. 10, each of the C element circuits I64 and I66 has PMOSs 63, 64 and 65 electrically series-connected between a source potential Vcc and a node N68, NMOSs 60, 61 and 62 electrically series-connected between the node N68 and a ground potential Vss, and an inverter I67 electrically connected between gate electrodes of the PMOS 64 and the NMOS 61 and a β terminal. An α terminal is electrically connected to gate electrodes of the PMOS 65 and the NMOS 60. A δ terminal is electrically connected to a gate electrode of the PMOS 63. A η terminal is electrically connected to a gate electrode of the NMOS 62.

The operation of the handshake control circuit will next be described.

When the initialization signal φ Ini becomes low in level, the nodes N60 and N62 are first brought to the source potential level Vcc. Next, when the handshake control circuit enters an input mode and the control signal φ 42 becomes high in level, the transfer gate circuit I62 is turned on and the C element circuits I64 and I66 are turned off. In doing so, the result of decision by the decision circuit 104$i$, which is indicative of whether data is good or bad, appears at the node N60.

When the handshake control circuit thereafter enters a running mode and the control signal φ 42 is rendered low in level, the transfer gate circuit I62 is turned off and the C element circuits I64 and I66 are turned on.

Now, when data "0" is captured form the node N60 to hold data "1" indicative of "failure" at the node N61 and data "1" is inputted to the node N60 of the next stage to hold the data "0" at the node N61 of the next stage, the node N63 of the next stage holds the data "0" upon the input mode. Therefore, the NMOSs 60, 61 and 62 of the C element circuit I64 are turned on. Thus, since the node N62 becomes low in level and the node N64 becomes high in level, the data "1" at the node N61 is shifted to the node N64.

Further, since the node N64 of the following stage is also held at the data "1", the C element circuit I66 of the next stage is activated in the same manner as described above so that the data "1" at the node N64 is shifted to the node N61 of the next stage.

Since the data "1" is shifted to the node N61 of the next stage when the handshake control circuit is in the running mode, the node N63 (input terminal D) of the next stage becomes high in level. As a result, the NMOS 61 of the C element circuit I64 is turned off. When the data supplied from the output terminal B of the preceding stage is "1" at this time, the node N61 of the next stage becomes a low level indicative of data "0". On the other hand, when the data supplied from the output terminal B of the preceding stage is "0", the node N61 of the next stage becomes a high level indicative of data "1".

When the node N61 of the next stage is at the low level indicative of the data "0", the node N63 (input terminal D) of the next stage becomes high in level so that the node N64 (output terminal E) of the next stage is brought to the low level indicative of the data "0". When the node N61 of the next stage is at the high level indicative of the data "1", the node N64 (output terminal E) of the next stage is brought to the high level indicative of the data "1" before the node N63 (input terminal D) of the following stage becomes high in level.

Further, since the NMOS 61 of the preceding-stage C element circuit I64 is turned off when the node N61 of the next stage is at the high level indicative of the data "1", the node N61 of the next stage holds the data "1". When the node N61 of the next stage is brought to the low level indicative of the data "0", the data "1" at the next stage begins to shift.

By repeating such operations, only the results of decisions each indicative of the data "1" are stored in order from the final stage.

According to such a construction, an advantageous effect can be obtained in addition to the aforementioned advantageous effect in that since no collision occurs between the levels at the time of the transition of the handshake control circuit from the initial state to the operating state and no transfer gate is provided on a data transmission route or path, a high-speed and stable operation can be expected.

Figure 11:
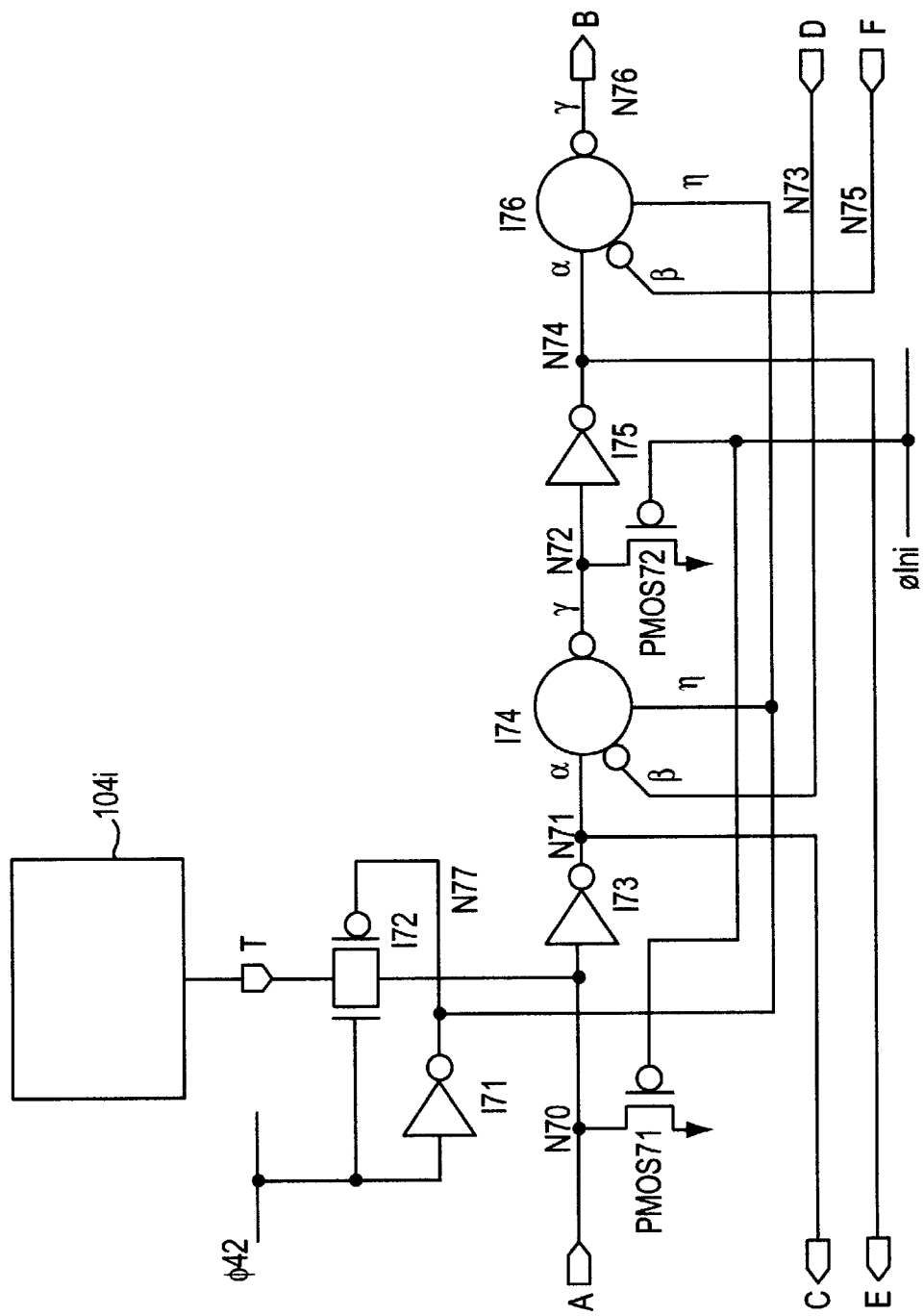
FIG. 11 is a circuit block diagram illustrating a further modification of the fifth embodiment.

A further example of the handshake control circuit will next be described with reference to FIGS. 11 and 12.

Figure 12:
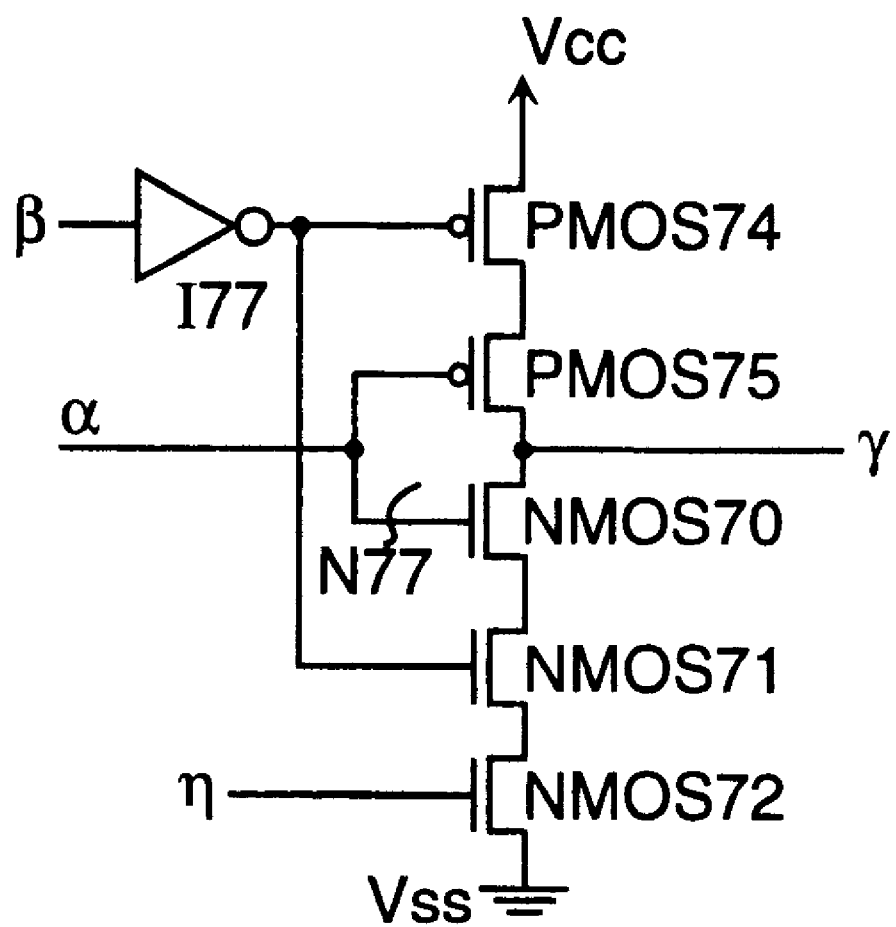
FIG. 12 is a circuit diagram depicting a C element circuit employed in the further modification shown in FIG. 11.

This type of handshake control circuit comprises an inverter I71 whose input is supplied with a control signal φ 42, a transfer gate circuit I72 electrically connected between an input terminal T electrically connected to a decision circuit 104*i* and a node N70 (input terminal A) and composed of an NMOS whose gate electrode is supplied with the control signal φ 42 and a PMOS whose gate electrode is electrically connected to the output of the inverter I71, a PMOS 71 whose drain and source electrodes are respectively electrically connected to the node N70 and a source potential Vcc and whose gate electrode is supplied with an initialization signal φ Ini, an inverter I73 whose input and output are respectively electrically connected to the node N70 and a node N71, a C element circuit I74 (whose specific circuit is shown in FIG. 12) whose α, β and γ terminals are respectively electrically connected to the node 71, a node N73 (input terminal D) and a node N72, and whose η terminal is electrically connected to a node N77, an inverter I75 whose input and output are respectively electrically connected to the node N72 and a node N74, a C element circuit I76 (whose specific circuit is illustrated in FIG. 12) whose α, β and γ terminals are respectively electrically connected to the node N74, a node N75 (input terminal F) and a node N76 (output terminal B) and whose η terminal is electrically connected to the node N77, and a PMOS 72 whose drain and source electrodes are respectively electrically connected to the node 72 and the source potential Vcc and whose gate electrode is supplied with the initialization signal φ Ini.

The input terminal A is electrically connected to an output terminal B of a preceding-stage handshake control circuit. An input terminal D is electrically connected to the output terminal C of the following-stage handshake control circuit, and an input terminal F is electrically connected to the output terminal E of the next-stage handshake control circuit.

As shown in FIG. 12, each of the C element circuits I74 and I76 has PMOSs 74 and 75 electrically series-connected between a source potential Vcc and a node N78, NMOSs 70, 71 and 72 electrically series-connected between the node N78 and a ground potential Vss, and an inverter I77 electrically connected between gate electrodes of the PMOS 74 and the NMOS 71 and a β terminal. An α terminal is electrically connected to gate electrodes of the PMOS 75 and the NMOS 70. A η terminal is electrically connected to a gate electrode of the NMOS 72.

The operation of the handshake control circuit will next be described.

When the initialization signal φ Ini is brought to a low level, the nodes N70 and N72 first reach the source potential level Vcc. Next, when the handshake control circuit enters an input mode and the control signal φ 42 is brought to a high level, the transfer gate circuit I72 is turned on and the C element circuits I74 and I76 are turned off. In doing so, the result of decision by the decision circuit 104*i*, which indicates whether data is good or bad, appears at the node N70.

When the handshake control circuit thereafter enters a running mode and the control signal φ 42 is rendered low in level, the transfer gate circuit I72 is turned off and the C element circuits I74 and I76 are turned on.

Now, when data "0" is captured form the node N70 to hold data "1" indicative of "failure" at the node N71 and data "1" is inputted to the node N70 of the next stage to hold the data "0" at the node N71 of the next stage, the node N73 of the next stage holds the data "0" upon the input mode. Therefore, the NMOSs 70, 71 and 72 of the C element circuit I74 are turned on. Thus, since the node N72 becomes low in level and the node N74 becomes high in level, the data "1" at the node N71 is shifted to the node N74.

Further, since the node N74 of the following stage is also held at the data "1", the C element circuit I76 of the next stage is activated in the same manner as described above so that the data "1" at the node N74 is shifted to the node N71 of the next stage.

Since the data "1" is shifted to the node N71 of the next stage when the handshake control circuit is in the running mode, the node N73 (input terminal D) of the next stage becomes high in level. As a result, the NMOS 71 of the C element circuit I74 is turned off. When the data supplied from the output terminal B of the preceding stage is "1" at this time, the node N71 of the next stage becomes a low level indicative of data "0". On the other hand, when the data supplied from the output terminal B of the preceding stage is "0", the node N71 of the next stage becomes a high level indicative of data "1".

When the node N71 of the next stage is at the low level indicative of the data "0", the node N73 (input terminal D) of the next stage becomes high in level so that the node N74 (output terminal E) of the next stage is brought to the low level indicative of the data "0". When the node N71 of the next stage is at the high level indicative of the data "1", the node N74 (output terminal E) of the next stage is brought to the high level indicative of the data "1" before the node N73 (input terminal D) of the following stage becomes high in level.

Further, since the NMOS 71 of the preceding-stage C element circuit I74 is also turned off when the node N71 of the next stage is at the high level indicative of the data "1", the node N71 of the next stage holds the data "1". When the node N71 of the next stage is brought to the low level indicative of the data "0", the data "1" at the next stage begins to shift.

By repeating such operations, only the results of decisions each indicative of the data "1" are stored in order from the final stage.

According to such a construction, an advantageous effect can be obtained in addition to the aforementioned advantageous effect in that when either one of the high and low levels is used, the number of elements in the handshake control circuit can be reduced and since no transfer gate is provided on a data transmission route or path, a high-speed and stable operation can be expected. Further, since the levels at all the nodes on the principal transmission paths are determined in the initial state, a stabler operation can be expected.

According to the construction of the handshake control circuit employed in the present embodiment described above, it is possible to collect data at high speed, realize a stable operation while maintaining a high-speed operation and reduce the number of elements while maintaining a high-speed and stable operation.

Although the handshake control circuit is used for transfer of each address at high speed in the present embodiment, it may be applied to the compression or the like of image data.

Figure 13:
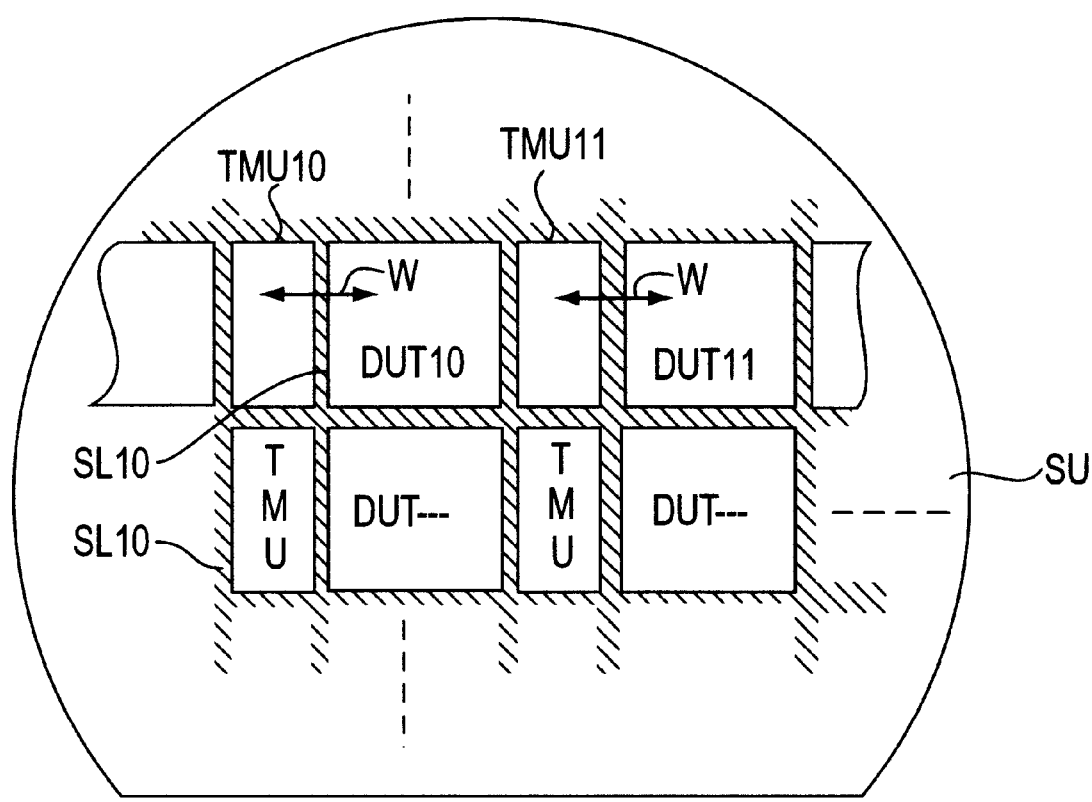
FIG. 13 is a partial layout showing a sixth embodiment of the present invention.
Figure 14:
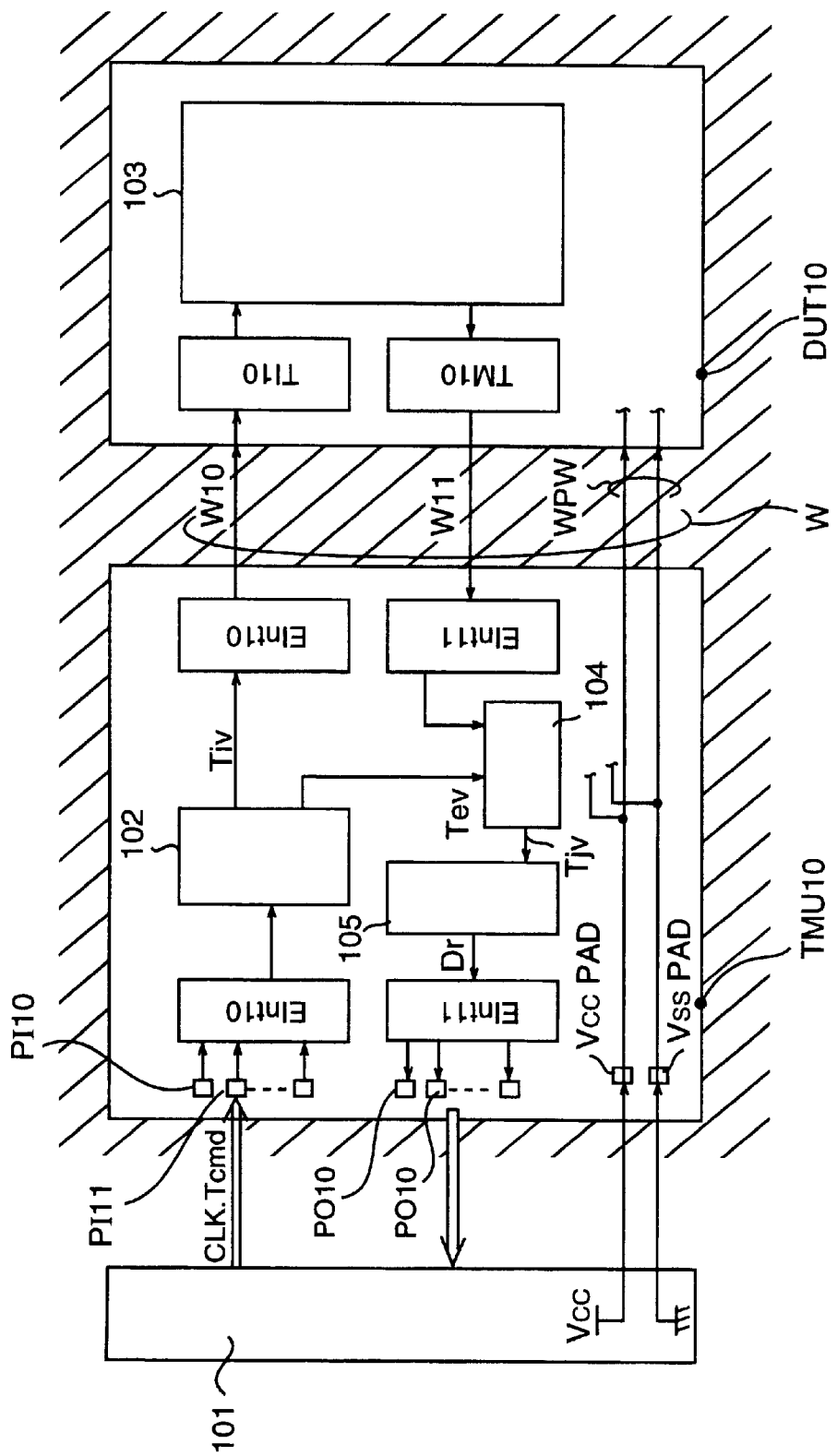
FIG. 14 is a partial circuit block diagram illustrating the sixth embodiment.
Figure 15:
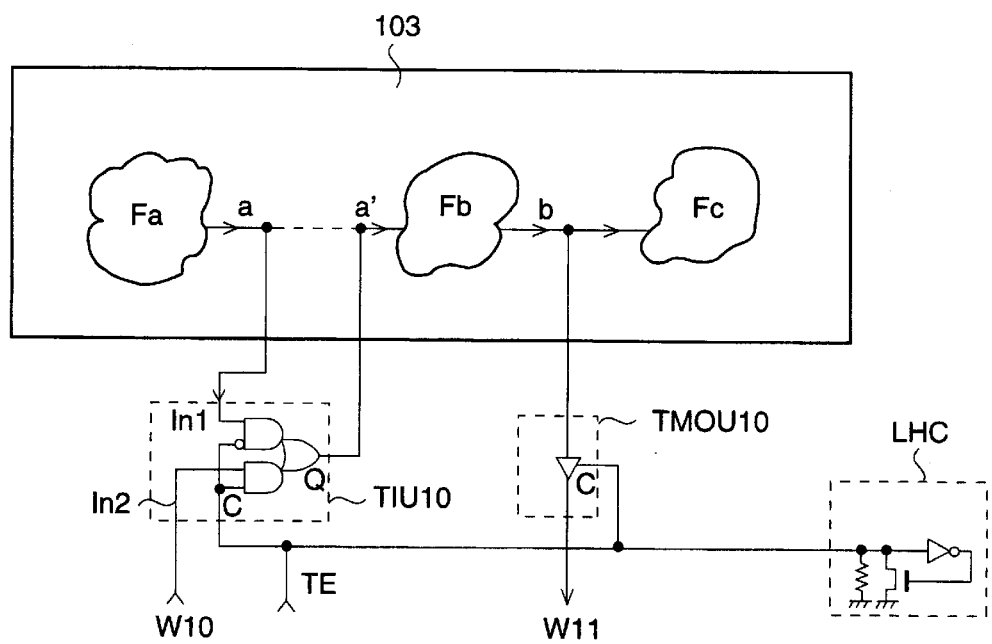
FIG. 15 is a circuit block diagram showing the sixth embodiment in detail.
Figure 16:
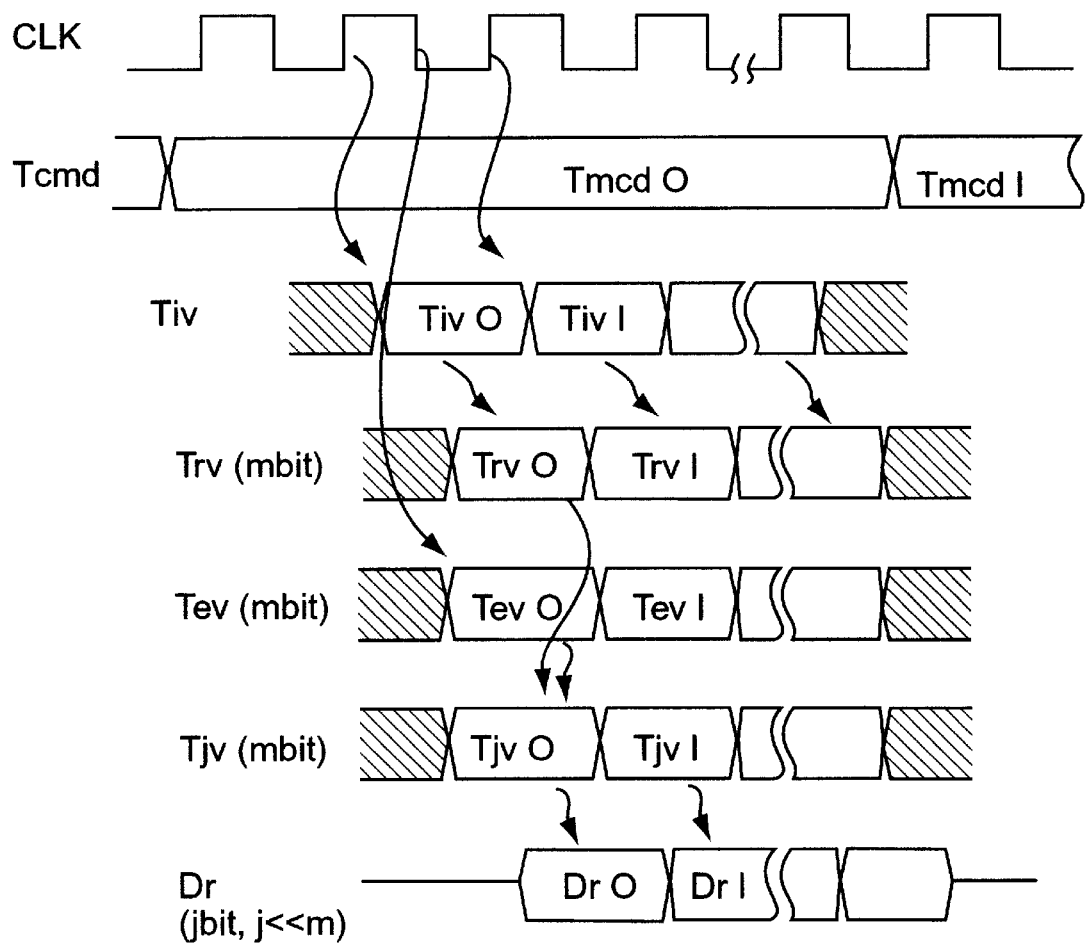
FIG. 16 is a partial timing chart for describing the operation of the sixth embodiment.

A sixth embodiment of the present invention will next be described with reference to FIGS. 13 through 16. FIG. 13 shows an embodiment related to a layout of a semiconductor device of the present invention on a wafer. FIG. 14 is a diagram specifically illustrating an internal configuration of the semiconductor device shown in FIG. 13. In the present embodiment, detailed configurations and operations of respective portions can refer to those employed in the above-described embodiment. FIG. 15 is a diagram showing connecting portions employed in the present embodiment. FIG. 16 is a timing chart for describing the relationship between the operations of the respective portions. The present timing chart can be used even for understanding the operations performed by the above-described embodiment.

As shown in FIG. 13, a plurality of target devices DUT10, DUT11, . . . to be tested, such as the above-described semiconductor memory circuit 103 or the like are placed on a semiconductor wafer SU. Test management devices TMU10, TMU11, . . . each composed of the above-described test pattern generator 102, decision unit 104 and translation unit 105 or the like are respectively disposed adjacent to the target devices DUT10, DUT11, . . . These target devices and test management devices are partitioned by a scribe line SL10 used as a cutting region during a scribe process to be described later.

These target devices and test management devices are respectively connected to one another by connecting means W formed on the scribe line SL10. The transfer of data and control signals or the like between the two is performed.

FIG. 14 specifically illustrates configurations of the target device DUT10 and the test management device TMU10.

The test management device TMU10 comprises an interface EInt10 for receiving various instructions or commands from a test means 101 through input pads PI10, PI11, . . . , an interface EInt11 for outputting data to the test means 101 through output pads PO10, PO11, . . . , a test pattern generator 102 for receiving an instruction or command from the interface EInt10, an interface TInt10 for supplying an instruction or command issued from the test pattern generator 102 to the target device DUT10, an interface TInt 11 for receiving data from the target device DUT10, a determination or decision unit 104, and a converting or translation unit 105.

In response to a test start command outputted from the test means 101, the test pattern generator 102 supplies a test pattern and a test command to the interface TInt10 and supplies an expected value to the decision unit 104 as described above.

The interface TInt10 is electrically connected to an interface TI10 of the target device DUT10 through a connecting means W10. The semiconductor memory circuit 103 is tested in accordance with the test pattern and the test command supplied to the interface TI10. Data indicative of the result of its test is supplied to an interface TM10 as described in the aforementioned embodiment. The data supplied to the interface TM10 is supplied to the interface TInt 11 through a connecting means W11.

The data supplied to the interface TInt11 is compared with a reference value by the decision unit 104. The result of comparison is outputted to the translation unit 105 as the result of decision. The translation unit 105 performs address translation or the like as described above and supplies the result thereof to the interface EInt11.

In order to supply power to the target device DUT10 upon testing, the test management device TMU10 is provided with a power pad Vcc supplied with a drive voltage and a power pad Vss supplied with a ground voltage. The voltages supplied through these pads are coupled or supplied to internal interconnections for supplying power to the test management device TMU10 and supplied to the target device DUT10 through connecting means WPW.

The interface TI10 for issuing a command to each of nodes in each circuit provided within the target device DUT10 and the interface TM10 for monitoring a logic stage of each node in the circuit will next be described in brief with reference to FIG. 15. In the same drawing, unit circuits that constitute individual interfaces, are shown.

Unit circuits TIU10 and TMQU10, have input terminals C thereof, each supplied with a control signal, and each are respectively electrically connected to a control input terminal TE and a level holding means LHC having the function of holding a level. The control input terminal TE is electrically connected to the interface TInt10 and is supplied with the control signal from the test management device TMU10.

The unit circuit TIU10 has input terminals In1 and In2, and outputs a signal based on a logic level at the input terminals thereof, from an output terminal Q thereof.

Now consider that a circuit to be tested has a circuit group composed of sub circuits Fa, Fb and Fc. The relationship of connection between the respective unit circuits and the tested circuit will be described. Upon design free from consideration of testing, an output node a of the sub circuit Fa is electrically connected to an input node a' of the sub circuit Fb. In the present embodiment, however, there is no connection between the nodes a and a'. The node a is electrically connected to the input terminal In1 of the unit circuit TIU10, whereas the node a' is electrically connected to the output terminal Q. The input terminal In2 of the unit circuit TIU10 is electrically connected to the test management device TMU10 through the connecting means W10.

On the other hand, the unit circuit TMQU10 is of a buffer circuit for bringing its output into high impedance (High-Z) or outputting an input signal based on the logic level of the control terminal C. An input terminal of the buffer circuit is electrically connected to a node b corresponding to the output of the sub circuit Fb (also corresponding to the input of the sub circuit Fc) and the output of the buffer circuit is electrically connected to the interface TInt11 of the test management device TMU10 through the connecting means W11. The response of the sub circuit Fb can be tested in the above-described manner.

The operations of the embodiment having the above configurations will next be described in brief using the timing chart shown in FIG. 16. The present operations can be easily understood by reference to the description of the above operations. This timing chart will further define the operations as well as the description of the operations of the above-described embodiments.

Upon a test operation, the test management device TMU10 is electrically connected to the test means 101 through the input pads PI10, PI11, . . . and the output pads PO10, PO11, . . .

Further, the test means 101 supplies a dock signal CLK and a test start command Tcm (e.g., Tcmd0, Tcmd1, . . . ) to the interface EInt10.

The test pattern generator 102 generates a test pattern and a test command (e.g., Tiv0, Tiv1, . . . ) programmed in advance and an expected value Tev (e.g., Tev0, Tev1, . . . ) therefrom in response to the test start command Tcmd. The test pattern and the test command Tiv are supplied to the target device DUT10 through the interface TInt10 and the connecting means W10.

In the target device DUT10, the test pattern and the test command Tiv are supplied to the respective nodes in the circuit through the interface TI10.

Thereafter, m-bit data Trv (e.g., Trv0, Trv1, . . . ) responsive to the input test pattern and test command Tiv are supplied to the interface TInt11 of the test management device TMU10 through the interface TM10 and the connecting means W11.

The data Trv inputted to the decision unit 104 via the interface TInt11 is compared with the expected value Tev by the decision unit 104. The decision unit 104 outputs the result of comparison therefrom as a decision result Tjv (e.g., Tjv0, Tjv1, . . . ). If the data Trv and the expected value Tev are respectively m bits as described above, then the result of decision Tjv becomes m bits as a matter of course.

Next, after the result of decision Tjv represented in the m bits has been compressed to j-bit data (address word) by the translation unit 105, the translation unit 105 outputs it to the test means 101 as test data Dr (e.g., Dr0, Dr1, . . . ).

When a request up to the specification or determination of a defective or bad portion is not made, it is needless to say that all the bits for the result of decision Tjv are ANDed.

After the target device DUT10 has been cut by a scribe line during the subsequent scribe process, each node connected to the control signal terminal TE by the level holding means LHC is brought to such a predetermined level as to invalidate the above-described test function within the target device DUT10. As a result, the interface TI10 makes the logic of each internal node through at all times and the output of the interface TM10 is brought to high impedance. Namely, the target device DUT10 can be prevented from being unstably activated due to the fact that after it has been cut by the scribe lines during the scribe process, the respective nodes (cut portions) of the connecting means W are brought into a floating state.

According to the construction of the above-described embodiment, the following advantageous effects can be brought about in addition to the advantageous effects described in the aforementioned other embodiments.

Namely, since the test management devices used upon testing of the target devices are provided outside the scribe lines which surround the target devices respectively, each high-function test management device can be designed without any restrictions on a circuit size of each target device. Since the high-function test management device can be realized in this way with the increase in the degree of freedom of the design on each test management device, a test time interval can be shortened even to a device whose circuit size is so strictly restricted.

Further, since the design of a layout of each test management device can be done independently of that of a layout of each target device, the test management device can be designed with high general versatility. Further, the test management device can be applied to various devices by changing the interfaces alone.

A seventh embodiment of the present invention will next be described with reference to FIG. 17.

Figure 17:
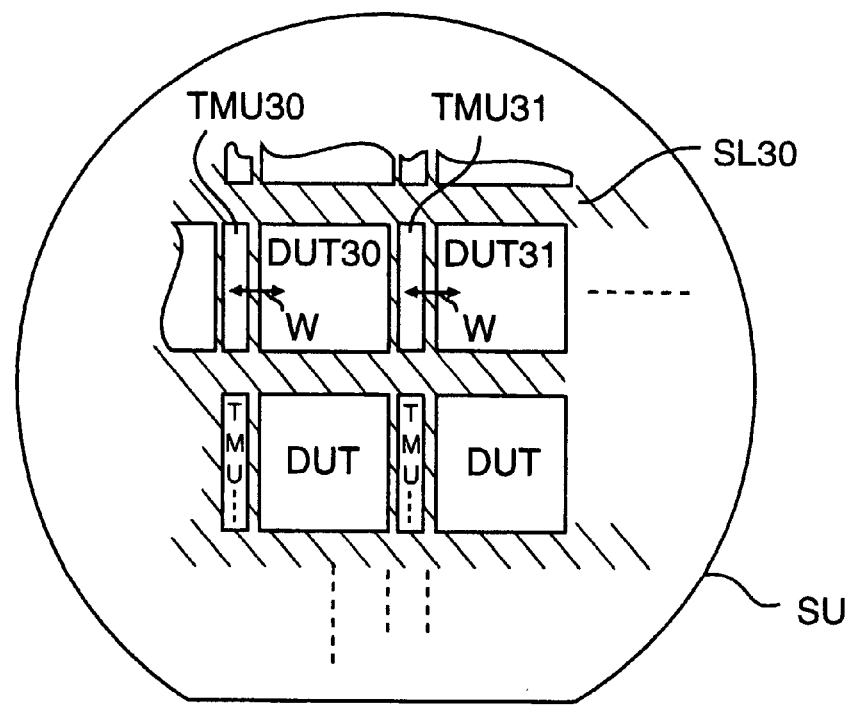
FIG. 17 is a partial layout illustrating a seventh embodiment of the present invention.

As shown in FIG. 17, a plurality of target devices DUT30, DUT31, . . . are disposed on a semiconductor wafer SU. Test management devices TMU30, TMU31, . . . are respectively provided adjacent to the target devices DUT30, DUT31, . . . . In the sixth embodiment referred to above, the test management devices TMU30, TMU31, . . . are respectively disposed outside the scribe lines provided around the target devices DUT30, DUT31, . . . In the present embodiment, however, the test management devices TMU30, TMU31, . . . are respectively disposed within their corresponding scribe lines.

Functions and operations of respective portions employed in the present embodiment will be understood by reference to the description of the above-described embodiment.

According to the present embodiment, since the test management devices are respectively placed on the scribe lines used as cutting regions, the respective devices are efficiently disposed on the wafer. Namely, if the respective devices are equal in size to those employed in the sixth embodiment, a larger number of devices can be disposed thereon. Alternatively, if the number of the devices placed on the wafer is equal to that employed in the sixth embodiment, a margin of space can be made to a region in which the devices are disposed, thereby making it possible to dispose devices which further increase the degree of freedom of their design or are higher in function and complexity.

Thus, it can be said that the present embodiment can contribute to a reduction in cost.

Figure 18:
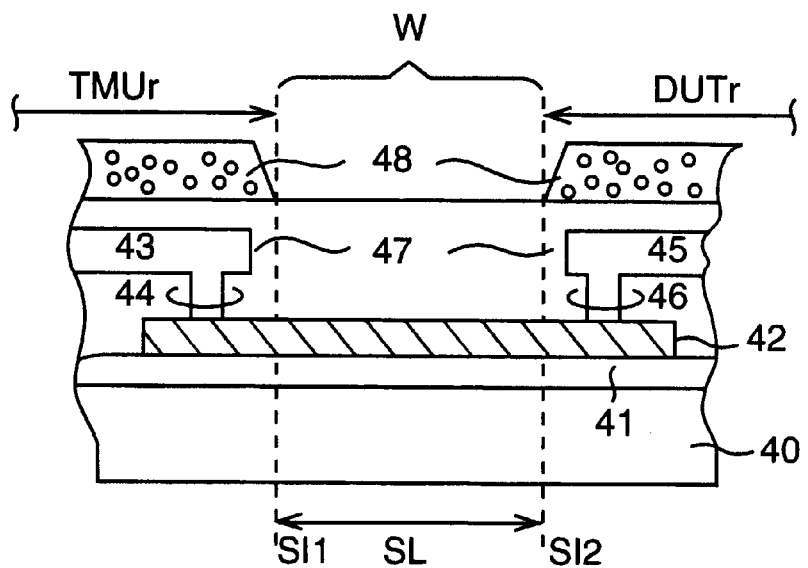
FIG. 18 is a partially sectional view depicting an eighth embodiment of the present invention.

An eighth embodiment of the present invention will next be described with reference to FIG. 18. In the present embodiment, a specific structure of the connecting means W employed in the sixth embodiment is illustrated. Although the configuration of the connecting means W employed in the sixth embodiment is specifically described herein, the configuration of a connecting means employed in the seventh embodiment can be also easily understood from the following description.

The connecting means W performs the transfer of data and signals between a test management device TMU formed in a test management device region TMUr and a target device DUT formed in a target device region DUTr and the supply of power therebetween.

The test management device region TMUr and the target device region DUTr are partitioned by a scribe line region SL. The scribe line region SL is cut during the subsequent scribe process. At this time, cut surfaces SI1 and SI2 are formed. A scribe line is formed between the cut surface SI1 and the cut surface SI2.

In the scribe line region SL, a field oxide layer 41 is formed on a semiconductor substrate 40 (wafer SU). A conductive portion 42 composed of polysilicon or polysilicide is formed on the field oxide layer 41 so as to extend from the test management device region TMUr to the target device region DUTr.

At the outside of the scribe line region SL, one end of the conductive portion 42 is electrically connected to a metal pattern or interconnection 43 corresponding to an internal node of the test management device TMU formed in the test management device region TMUr through a contact 44. At the outside of the scribe line region SL, the other end of the conductive portion 42 is electrically connected to a metal interconnection 45 corresponding to an internal node of the target device DUT formed in the target device region DUTr through a contact 46.

An intra-insulating layer 47 is formed on the conductive portion 42 and the metal interconnections 43 and 45. A passivation layer 48 is formed on the intra-insulating layer 47.

According to the present embodiment, since the metal interconnections are not exposed after the scribe line region SL has been cut during the subsequent scribe process, excellent moisture resistance can be expected. Further, since shavings produced during the scribe process are of polysilicon or polysilicide substantially identical in composition to the substrate, the influence of the shavings on the surroundings can be minimized in the subsequent assembly process.

A ninth embodiment of the present invention will next be described with reference to FIG. 19.

Figure 19:
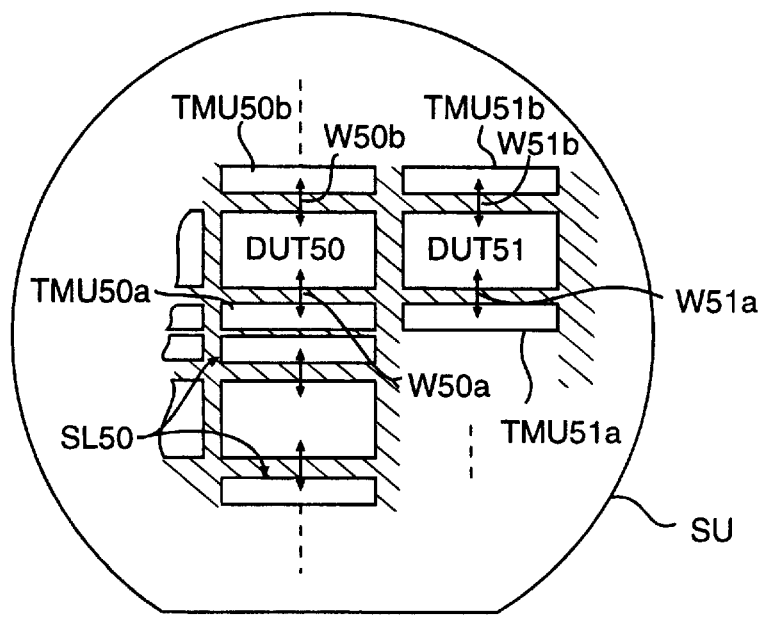
FIG. 19 is a partial circuit layout illustrating a ninth embodiment of the present invention.

As shown in FIG. 19, a plurality of target devices DUT50, DUT51, . . . are disposed on a semiconductor wafer SU.

The present embodiment is different from the sixth and seventh embodiments in that two test management devices TMUa and TMUb corresponding to each target device DUT are respectively disposed adjacent to the opposed two sides of the target devices DUT.

Namely, test management devices TMU50a and TMU50b are provided adjacent to a target device DUT50 in divided form. Similarly, test management devices TMU51a and TMU51b are disposed adjacent to a target device DUT51. In the present embodiment, the test management devices TMU are respectively disposed outside scribe lines formed around the target devices DUT.

In a manner similar to the above-described embodiment, the target devices and the test management devices are respectively electrically connected to one another by connecting means W so that the transfer of data and control signals or the like between the two is performed. Namely, connecting means W50a and W50b are respectively formed between the target device DUT50 and the test management device TMU50a and between the target device DUT50 and the test management device TMU50b. Further, connecting means W51a and W51b are also respectively formed between the target device DUT51 and the test management device TMU51a and between the target device DUT51 and the test management device TMU51b.

Thus, if the present embodiment is applied according to the type of target device, then the length of a pattern or interconnection between each target device and each test management device can be minimized.

A tenth embodiment of the present invention will next be described with reference to FIGS. 20 and 21. The tenth embodiment shows an example in which the ninth embodiment is applied to a memory circuit having memory cell arrays.

Figure 20:
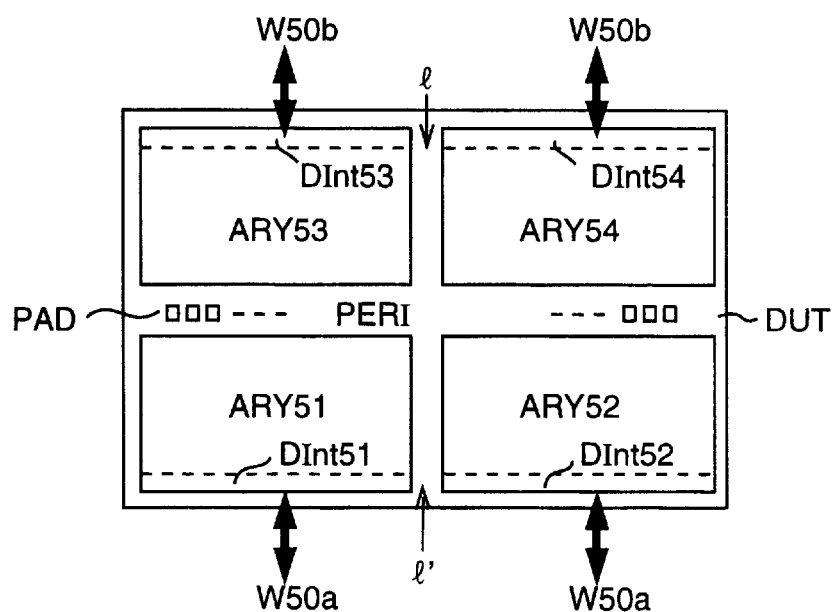
FIG. 20 is a partial circuit layout showing a tenth embodiment of the present invention.
Figure 21:
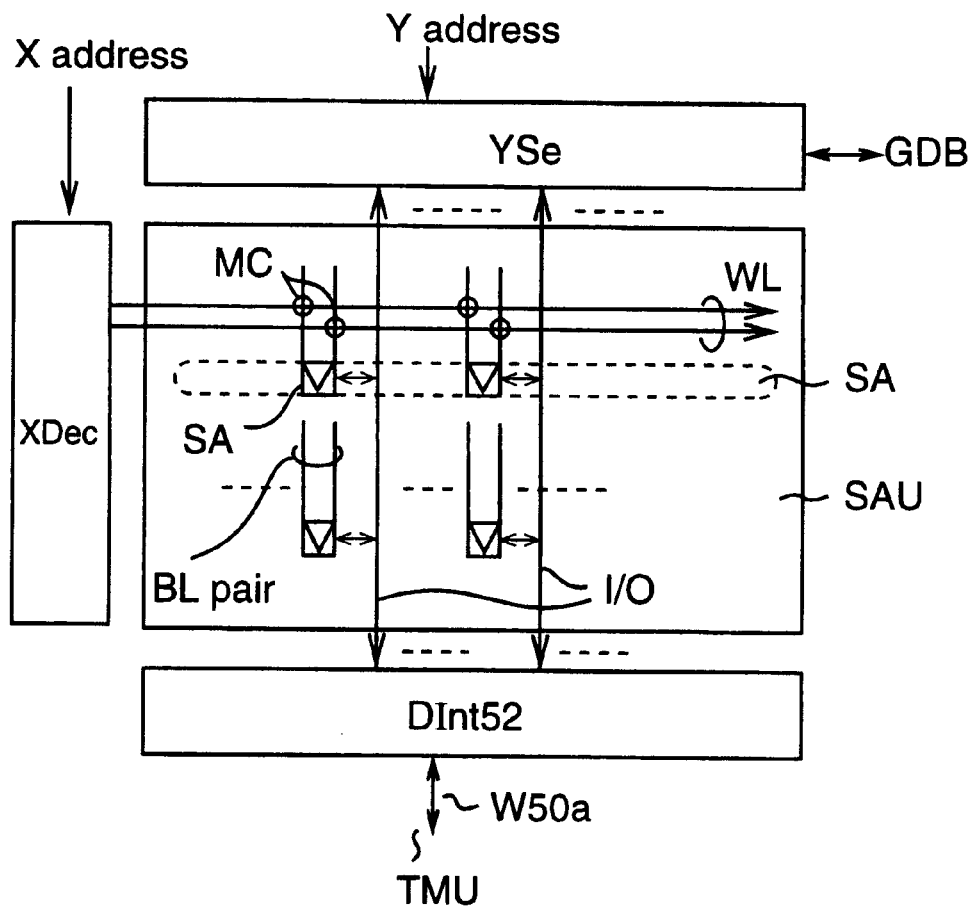
FIG. 21 is a circuit block diagram illustrating the tenth embodiment in detail.

As shown in FIG. 20, a memory circuit corresponding to a target device DUT has arrays ARY51, ARY52, ARY53 and ARY54 each having a plurality of memory cells arranged in matrix form, and a peripheral circuit region PER1 provided in the center of the memory circuit. The memory circuit is symmetrically provided with a line R–R' in the drawing as the axis. A plurality of wire bonding pads PADs are provided in the peripheral circuit region.

Interfaces Dint51, Dint52, Dint53 and Dint54 for transferring data to and from test management devices, for example, are respectively provided around the peripheries of the arrays ARY51, ARY52, ARY53 and ARY54. The interfaces Dint51 and Dint52 of these interfaces Dint51, Dint52, Dint53 and Dint54 are electrically connected to a connecting means W50a and the remaining interfaces Dint53 and Dint54 are electrically connected to a connecting means W50b.

A detailed configuration of each array ARY will now be described with reference to FIG. 21. In the following description, the array ARY52 is shown as an illustrative example. However, since other arrays are identical in configuration to this example, configurations of other arrays can be understood from the following description.

The array ARY52 comprises an X decoder (X-DEC) for selecting a predetermined word line WL from a plurality of word lines based on an X address, a Y selector (Y-SE) for selecting a predetermined data line I/O from a plurality of data lines I/O based on a Y address, a sense amplifier unit SAU and the interface Dint52.

The sense amplifier unit SAU comprises the plurality of word lines WL, a plurality of bit line pairs BLpair respectively orthogonal to the word lines WL, a plurality of memory cells MC respectively disposed between the word lines WL and the bit line pairs BLpair, sense amplifiers SA for amplifying data on the bit line pairs BLpair, and the data lines I/O supplied with the amplified data. One ends of the data lines I/O are electrically connected to the interface Dint52 and the other ends thereof are electrically connected to the Y selector (Y-SE).

When the array ARY52 is in a data read operation, the data supplied onto the respective data lines I/O from the individual sense amplifiers SA are collectively transferred to the Y selector (Y-SE). Thereafter, the Y selector (Y-SE) selects a predetermined data line I/O from the plurality of data lines I/O in accordance with the Y address and outputs data on the selected data line I/O to a global data line GDB.

On the other hand, when the array ARY52 is in a data write operation, write data is supplied to the data line I/O selected by the Y selector (Y-SE).

Since the read and write operations can be understood from the present disclosure and the general knowledge, they could be simply described.

A test operation of this array ARY52 will next be described below.

The predetermined word line WL is first activated based on the X address corresponding to an address supplied from the test management device TMU. Next, the write data supplied from the test management device TMU is written into all the memory cells MC connected to the word line WL. The write data is supplied to each sense amplifier SA from the interface Dint52 through each data line I/O (however, if all the bits representing the write data are expressed in the form of either "1" or "0" or are simply repeated in the form of "1" and "0" for each bit, then a configuration for applying its function to the Y selector (Y-SE) is also considered).

On the other hand, when the array ARY52 is placed in the read operation, the respective data amplified by the individual sense amplifiers SA are transferred to the interface Dint52 through the respective data lines I/O. The interface Dint52 outputs the transferred data to the test management device TMU.

Accordingly, the test management device TMU is able to determine whether or not the operation of the memory circuit is good for each column of the memory circuit.

According to the present embodiment, test management devices and interfaces provided within a general memory LSI having a peripheral circuit region formed in the center of a circuit can be electrically connected to one another by the shortest patterns or interconnections through connecting means. Thus, interconnections used to connect a number of target devices and test management devices to one another are no longer routed within the target devices.

Further, since the test management devices are provided in divided form, the respective test management devices can be also activated in parallel, so that a further reduction in test time can be made.

An eleventh embodiment of the present invention will next be described with reference to FIGS. 22 through 25. In the present embodiment, a description will be made of a procedure from a process (pretreating process) of forming target devices and test management devices on a wafer to a test process and a procedure from the test process to a redundancy relieving process for performing redundancy relief based on the result of testing. Only a series of processes is described and the respective processes will not be described in detail. Further, the test process can be sufficiently understood from the above description and the following description.

Figure 22:
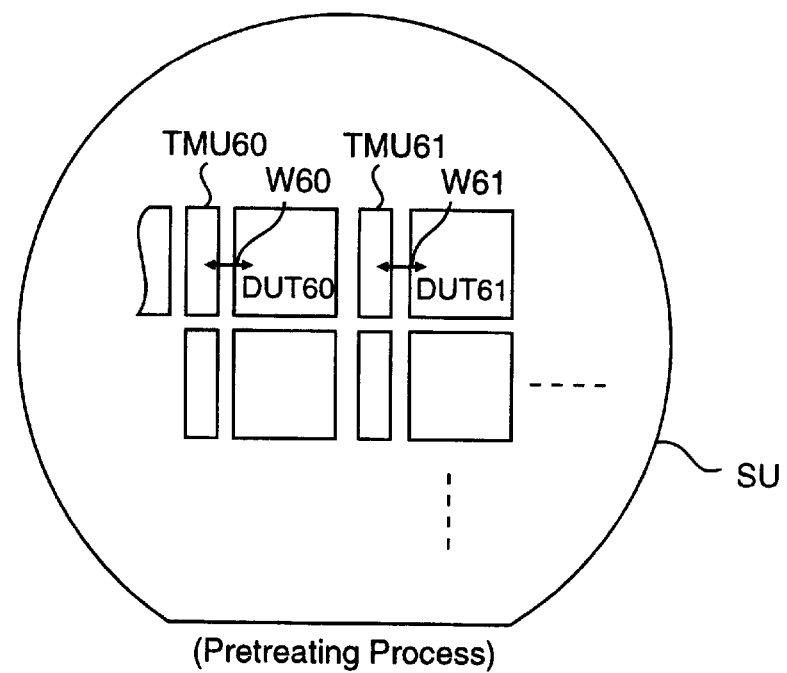
FIG. 22 is a partial layout (pretreating process) showing an eleventh embodiment of the present invention.

As shown in FIG. 22, target devices DUT60, DUT61, . . . and test management devices TMU60, TMU61, . . . are formed on a semiconductor wafer SU in the pretreating process. The target devices DUT60, DUT61, . . . and the test management devices TMU60, TMU61, . . . are respectively connected to one another by connecting means W60, W61, . . .

Figure 23:
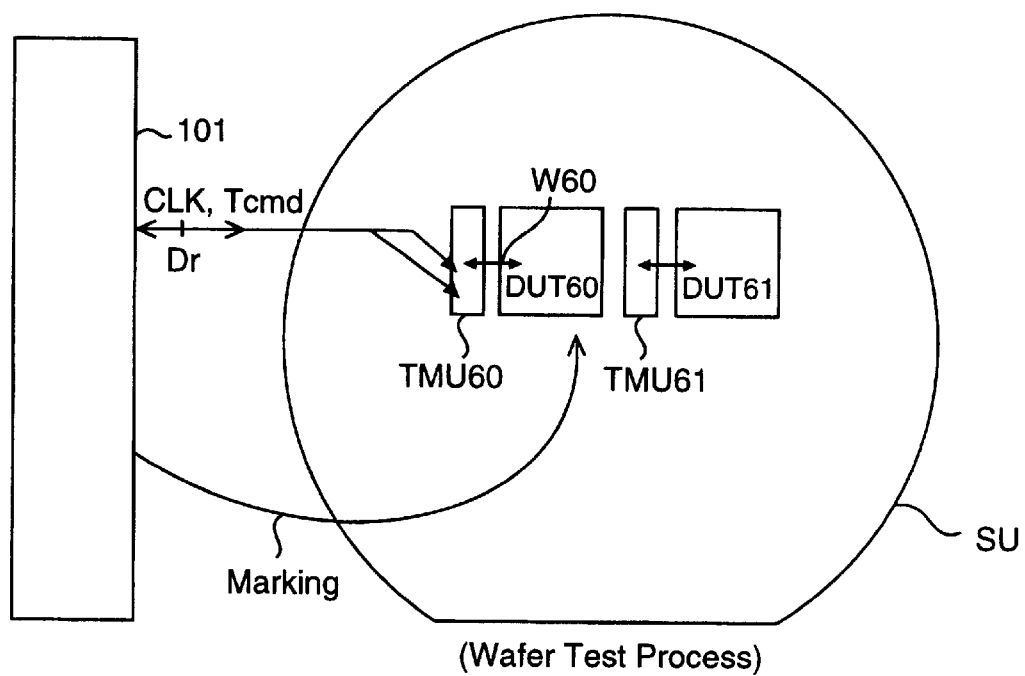
FIG. 23 is a partial layout (wafer test process) illustrating the eleventh embodiment.

In the test process as shown in FIG. 23, a probe (corresponding to a test needle or lead) of a test means 101 is next brought into contact with a probing pad formed on the surface of the test management device TMU60 so that the test management device TMU60 is supplied with a clock signal CLK, a test start command Tcmd and a drive voltage or the like.

Thereafter, the above-described test operation is carried out so that the result of testing Dr is outputted from the test management device TMU60 to the test means 101. The present test operation is performed by referring to all the test operations which are referred to above and will be described later.

Upon completion of the predetermined test, the test means 101 suitably effects Marking on the target device DUT60 according to the test result Dr. In the present embodiment, Marking is executed to classify respective devices as unmarked good products (with no Marking), redundancy-relievable products (with Marking of) and unrelievable products (Marking of v).

Thereafter, the test means 101 brings its probe into contact with a probing pad formed on the surface of the test management device TMU61 to test the target device DUT61.

Similarly, all the target devices DUT formed on the wafer are tested and subjected to Marking. The present embodiment shows a case in which the respective target devices are successively tested. However, the probe may be brought into contact with the respective target devices so that the target devices are simultaneously tested (parallel-measured).

Figure 24:
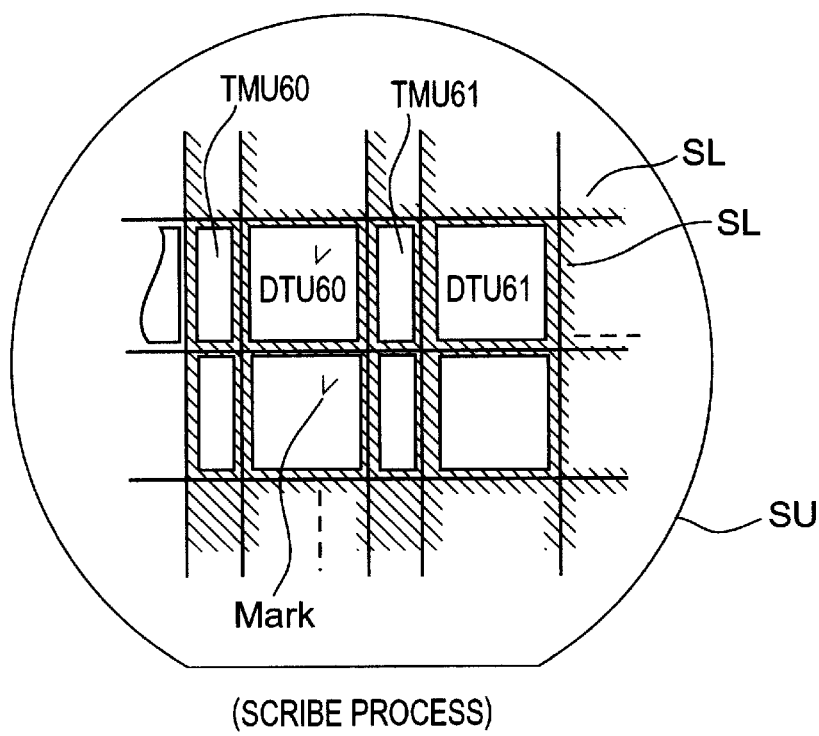
FIG. 24 is a partial layout (scribe process) showing the eleventh embodiment.

Thereafter, the wafer SU is cut along scribe lines SL on the wafer SU so as to obtain individual target devices as shown in FIG. 24. The so-obtained target devices are classified into good products, redundancy-relievable products and unrelievable products.

Figure 25:
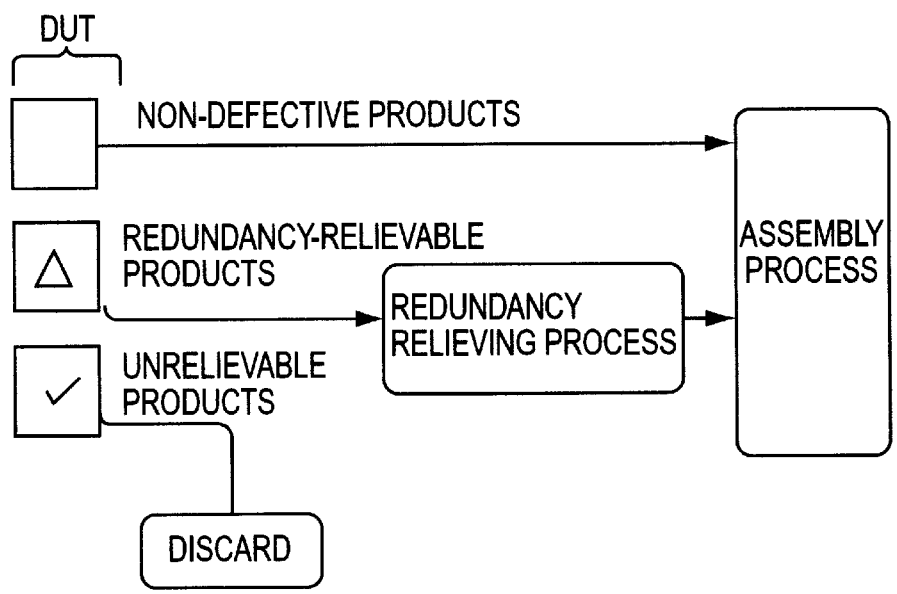
FIG. 25 is a flowchart (classifying process) for describing the eleventh embodiment.

Afterwards, as shown in FIG. 25, the devices judged as the non-defective products are sent to the subsequent assembly process, the devices determined as the redundancy-relievable products are delivered to the assembly process after the redundancy relieving process, and the devices judged as the unrelievable products are disposed.

According to the present embodiment as described above, since the test management devices are cut out before the assembly process, the size of each final product does not increase. Namely, it is possible to supply products small in size.

A twelfth embodiment of the present invention will next be described with reference to FIG. 26.

Figure 26:
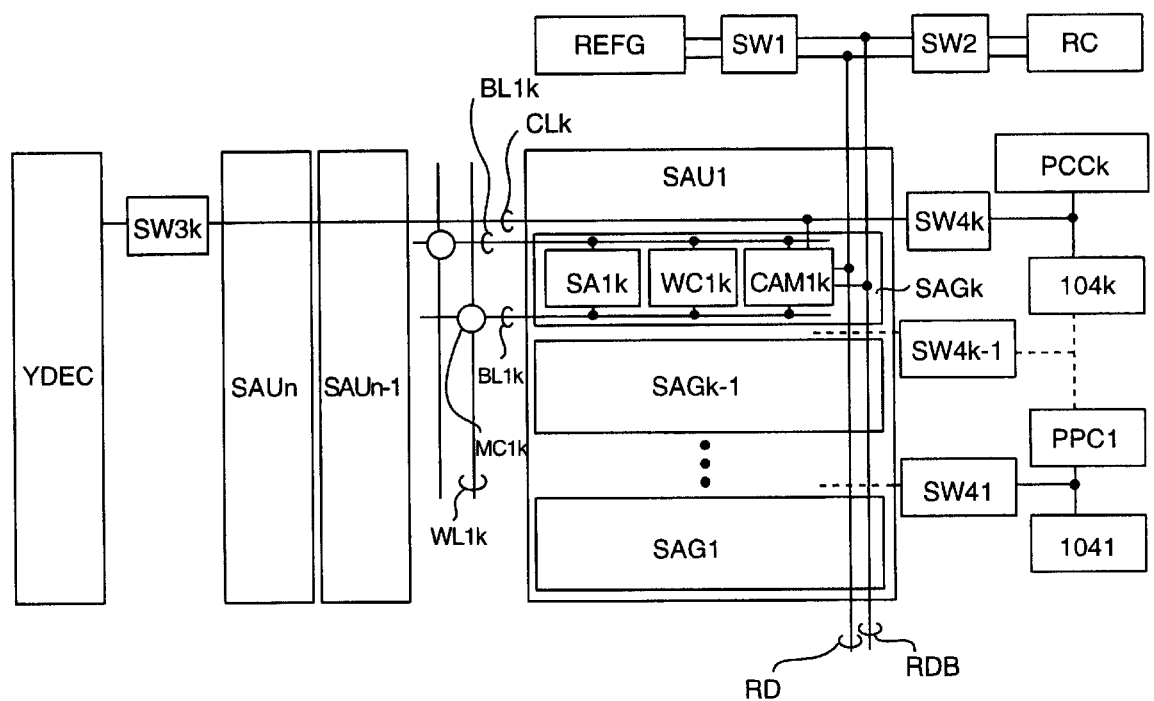
FIG. 26 is a partial circuit block diagram showing a twelfth embodiment of the present invention.

There are shown in FIG. 26, a plurality of sense amplifier units SAU1 through SAUn, a Y decoder YDEC for selecting a predetermined column from the sense amplifier units SAU1 through SAUn based on an address signal and supplying a column signal to a column line CLk of the selected column, read data buses RD and RDB for performing the transfer of data between the sense amplifier units SAU1 and SAUn, a read circuit RC for reading data on the read data buses RD and RDB to the outside, a reference signal generator REFG for supplying a reference signal of a reference level to the read data buses RD and RDB and supplying an expected value signal VR having a predetermined potential corresponding to an expected value to each of determination or decision circuits 1041 through 104m of a decision unit 104, precharge circuits PCC1 through PCCm for respectively precharging column lines, the decision unit 104 (composed of the decision circuits 1041 through 104m) for comparing the potential on each column line with the expected value signal VR and outputting the result of comparison therefrom, a first switch means SW1 disposed between the read data buses RD and RDB and the reference signal generator REFG, a second switch means SW2 disposed between the read data buses RD and RDB and the read circuit RC, third switch means SW31 through SW3m disposed between one end of the respective column lines CL and the Y decoder YDEC, and fourth switch means SW41 through SW4m disposed between the other end of the respective column lines CL and the respective decision circuits 1041 through 104m and the respective precharge circuits PCC1 through PCCm.

Further, the respective sense amplifier units are constructed in the following manner. Since the aforementioned respective sense amplifier units SAU1 through SAUn are identical in configuration to one another, the present embodiment will be described using the sense amplifier unit SAU1 herein. Further, since the sense amplifier unit SAU1 consists of sense amplifier groups SAGl through SAGm which correspond to the respective columns and are identical in configuration to one another, the present embodiment will be described using the sense amplifier group SAGk ($1 \leq k \leq m$).

The sense amplifier group SAGk comprises a sense amplifier SA1k for selecting a word line WL1k and amplifying data stored in a memory cell MC1k provided on a bit line pair BL1k, a write circuit WC1k for writing data into memory cell MC1k through the bit line pair BL1k, and a read circuit CAM1k having a data comparing function. A specific configuration and operation on the read circuit CAM1k will be described later.

Although various types are considered as the configurations of the aforementioned respective switch means SW1 through SW4, one composed of an N type MOS transistor is considered as one example. These respective switch means SW1 through SW4 are controlled by their corresponding control signals.

Figure 27:
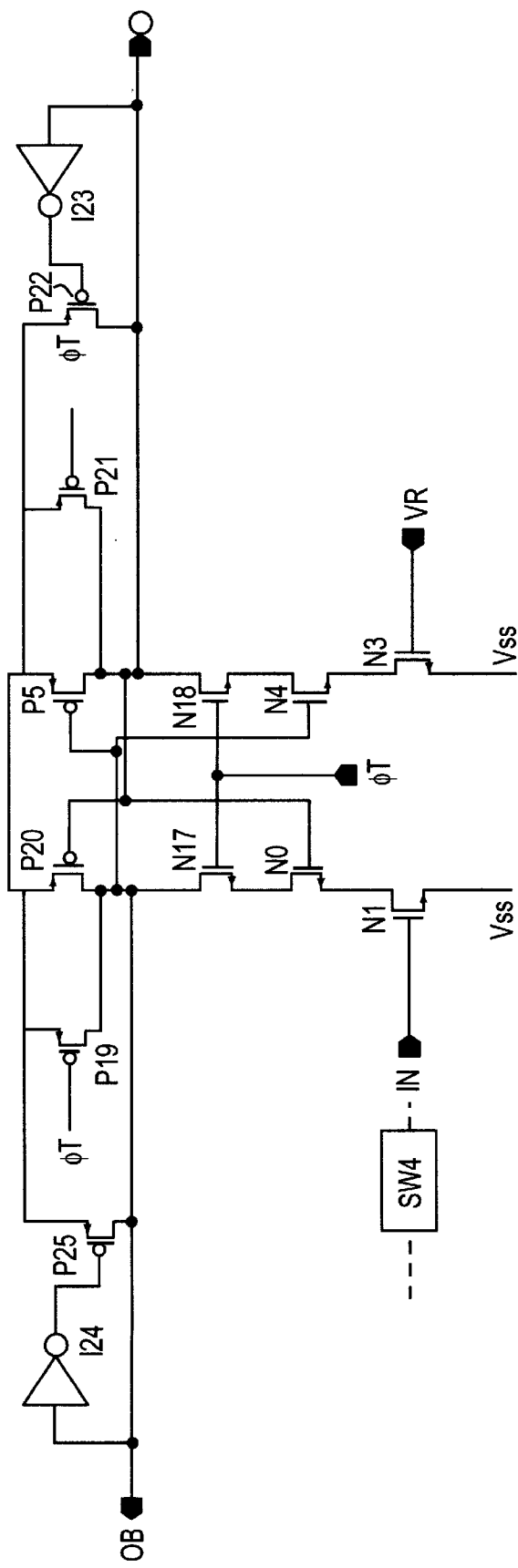
FIG. 27 is a circuit diagram illustrating a determination circuit employed in the twelfth embodiment.

Another configurational example of the decision circuit 104 is shown in FIG. 27. In the present example, data supplied to an input terminal IN from the corresponding sense amplifier unit through the fourth switch means SW4 is compared with an expected value VR. Thereafter, the result of comparison is outputted from output terminals O and OB. Since this configuration itself is of a generally-known comparing means, the description of its configuration and operation will be omitted.

The operation of the above-described circuit will next be described.

Upon a data read operation of the circuit, the second and third switch means SW2 and SW3k are turned on and the first and fourth switch means SW1 and SW4k are turned off. Thus, an arbitrary column line CL is selected by the Y decoder YDEC so that a read circuit CAM connected to the selected column line CL is activated. After data stored in a memory cell has been amplified, it is transferred to the read circuit RC through the read data buses RD and RDB.

When, for example, the column line CLk is selected SAU1, the read circuit CAM1k is activated. Further, the data stored in the memory cell MC1k, which is given or set on the bit line pair BL1k by selecting the word line WL1k, is amplified by the sense amplifier SA1k. Thereafter, the amplified data is supplied from the read circuit CAM1k to the read data buses RD and RDB. The read data buses RD and RDB transfer the data to the read circuit RC and hence the read circuit RC outputs read data to the outside based on the transferred data.

Next, upon a test operation of the circuit, the second and third switch means SW2 and SW3k are turned off and the first and fourth switch means SW1 and SW4k are turned on. Thus, the reference signal generator REFG supplies the reference signal of the reference level (corresponding to a source potential Vcc level or a ground potential Vss level in the present embodiment) to the read data buses RD and RDB. Therefore, the read data buses RD and RDB become the reference level. At this time, the precharge circuit PCCk precharges all the column lines CL1 through CLn to the source potential level Vcc.

Thereafter, a desired word line is selected so that read circuits CAM1 through CAMn are activated. Thus, each of the read circuits CAM1 through CAMn compares amplified data on each bit line pair BL with the reference level on the read data buses RD and RDB in response to a CAM control signal (to be described later) placed in the source potential level Vcc. Afterwards, each read circuit outputs the result of comparison to each of the column lines CL1 through CLn. The result of comparison outputted to each of the column lines CL1 through CLn is compared with the expected value signal VR by the decision circuit 104k. The result of comparison by the decision circuit 104k is outputted as the result of decision made as to whether data is either good or bad.

If a potential level corresponding to the amplified data on each bit line pair BL is now found to be equal to the reference level on each of the read data buses RD and RDB upon the above comparison between the data and the reference level by the read circuit CAM, then the potential on each column line CL remains held at the precharge level. Next, the unchanged potential on the column line CL is compared with the potential of the expected value signal VR. Based on the result of comparison, the decision unit 104 determines data on its column as "good". The result of decision by the decision unit 104 is outputted from each of the decision circuits 104l through 104m of the decision unit 104.

On the other hand, if the amplified data on each bit line pair BL is found to differ from the reference level on each of the read data buses RD and RDB, then the potential on the column line CL becomes lower than the precharge level. The changed potential on the column line CL is compared with the potential of the expected value signal VR. From the result of comparison, the decision unit 104 determines the data on its column as "bad or defective". The result of decision is outputted from each of the decision circuits 104l through 104m of the decision unit 104. By repeating such operations, a test on each column is executed.

According to the twelfth embodiment described above, since a decision as to whether data is good or bad can be carried out for every column, it is possible to specify portions in which defective data have occurred.

Further, since the column lines, which have heretofore been used only for mere column selection, can be used as lines from which data are read, upon the test operation owing to the provision of the first through fourth switch means, i.e., each column line used upon the normal operation and the line from which the data is read, can be commonly used, a structure having a function identical to that of a very complex and large-scale structure which has heretofore been considered to be necessary for specifying the portions in which the defective data have occurred, can be realized in a very simple and small-scale configuration.

Further, the defective portions specified by the construction of the present embodiment can be respectively efficiently replaced by spare memory cells in the subsequent redundancy relieving process. Namely, since only the defective portion can be replaced with the spare memory cell during the redundancy relieving process, it is unnecessary to eliminate needless waste of the spare memory cells and greatly shorten the time necessary for its replacement.

A lot of time is normally required upon the redundancy relieving process. Therefore, since the shortening of the time by the construction of the present embodiment contributes to a reduction in cost, the shortening of a period up to the supply of products, etc., a very great effect can be expected in a semiconductor field. Further, since the test means can be realized by such a simple configuration that only address data indicative of each defective portion can be stored, the test means is available at low cost.

Figure 28:
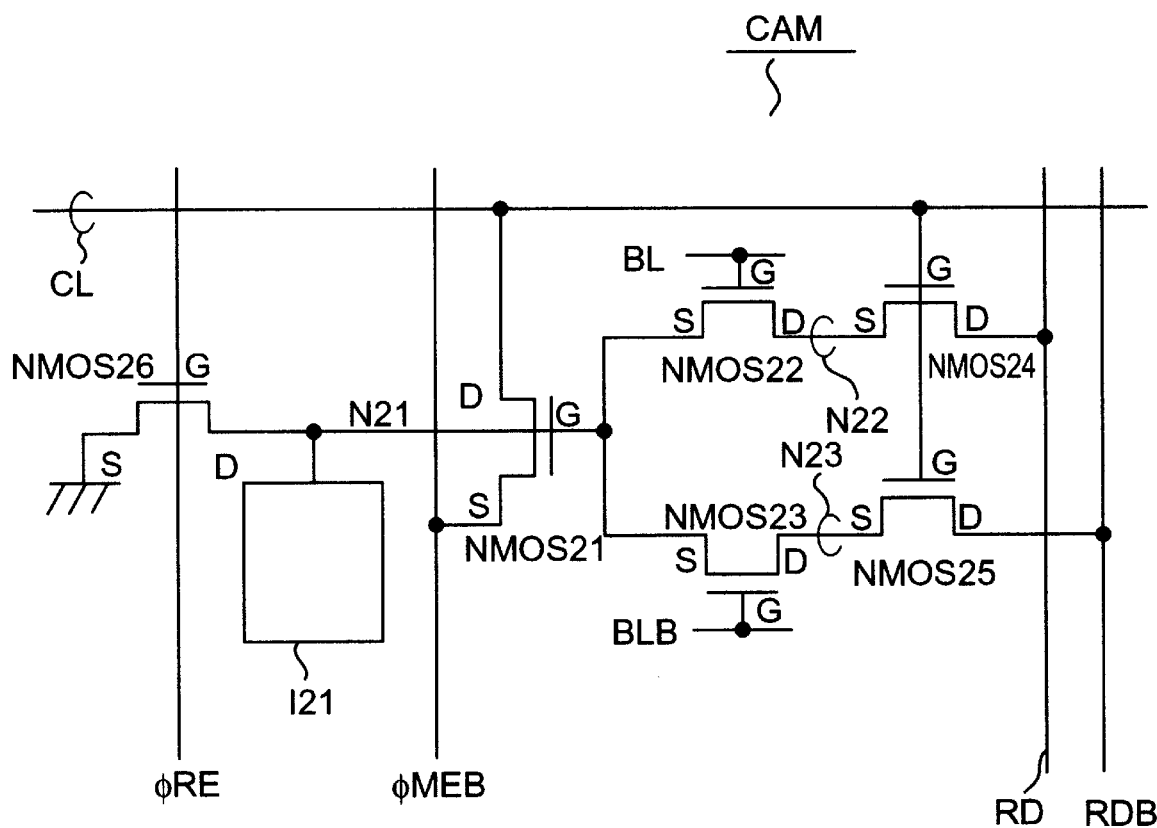
FIG. 28 is a partial circuit block diagram depicting a thirteenth embodiment of the present invention.

A thirteenth embodiment of the present invention will next be described with reference to FIG. 28. A specific description of the configuration of each read circuit CAM referred to above and a specific description about how the potential on each column line changes upon a test operation will be made centrally in the present embodiment.

The read circuit CAM comprises an NMOS 21 having a drain electrode electrically connected to a column line CL, a source electrode supplied with a CAM control signal φ MEB, and a gate electrode electrically connected to a node N21, an NMOS 22 having a drain electrode electrically connected to a node N22, a source electrode electrically connected to the node N21 and a gate electrode electrically connected to one bit line BL of a bit line pair, an NMOS 23 having a drain electrode electrically connected to a node N23, a source electrode electrically connected to the node N21 and a gate electrode electrically connected to the other bit line BLB of the bit line pair, an NMOS 24 having a drain electrode electrically connected to a read data bus RD, a source electrode electrically connected to the node N22 and a gate electrode electrically connected to the column line CL, an NMOS 25 having a drain electrode electrically connected to a read data bus RDB, a source electrode electrically connected to the node N23 and a gate electrode electrically connected to the column line CL, an NMOS 26 having a drain electrode electrically connected to the node N21, a source electrode electrically connected to a ground potential GND and a gate electrode supplied with a read control signal φ RE, and a precharge circuit 121 for initially setting the node N21 to a source potential Vcc level.

When the read circuit CAM enters the test operation mode described in the aforementioned twelfth embodiment, the level of the CAM control signal φ MEB is changed from a ground potential Vss level (low level) to an MEB potential level reduced by a predetermined potential from the source potential Vcc level (high level). As a result, the NMOS 26 is turned off and the NMOS 21 is turned on (because the node N21 is precharged to the source potential Vcc level by the precharge circuit I21). The column line CL is precharged to the source potential Vcc level by a precharge circuit PCC.

As described in other embodiments referred to above, the potential corresponding to the data stored in each memory cell is thereafter amplified by its corresponding sense amplifier and the amplified potential appears on its corresponding bit line pair.

Afterward, when, for example, a test is executed that the level of the potential on the bit line BL is expected to become the source potential Vcc level and the level of the potential on the bit line BLB is expected to become the ground potential Vss level, a reference signal generator REFG supplies a reference signal having the ground potential Vss level to the read data bus RD and supplies a reference signal having the source potential Vcc level to the read data bus RDB.

Since the NMOSs 22 and 24 are both turned on in this case, the potential level at the node N21 is lowered from the source potential Vcc level to the ground potential Vss level. Since the NMOS 21 is turned off at this time, the potential level on the column line CL is maintained at the precharged source potential Vcc level. The potential level on the column line CL is supplied to a decision circuit 104 through a fourth switch means SW4. The decision circuit 104 compares the potential level (source potential Vcc level) on the column line CL with a potential level of an expected value signal VR and outputs a decision result "non-defect" indicative of the fact that "data supplied to each bit line is normal".

On the other hand, when the potential level on the bit line BL becomes the ground potential Vss level and the potential level on the bit line BLB reaches the source potential Vcc level even when a test similar to the above-described test is executed, the read circuit CAM is activated as follows:

Namely, the NMOS 22 is turned off and the NMOSs 23 and 25 are both held off because the potential level at the node N21 is of a source potential Vcc level at the initial state of the read circuit CAM and the potential level at the node N23 is of a source potential Vcc level. Since the node N21 holds the source potential Vcc level at the initial state, the NMOS 21 is turned on so that the potential level on the column line CL is lowered from a precharged source potential Vcc level to an MEB potential level (corresponding to a level reduced by a predetermined potential from the source potential Vcc level).

The potential level on the column line CL is supplied to the decision circuit 104 through the fourth switch means SW4. The decision circuit 104 compares the potential level (MEB potential level) on the column line CL and a potential level of an expected value signal VR and outputs a decision result "defect or failure" indicative of the fact that "data supplied to each bit line is erroneous".

When, for example, a test is executed that the potential level on the bit line BL is expected to become the ground potential Vss level and the potential level on the bit line BLB is expected to become the source potential Vcc level, the reference signal generator REFG supplies a reference signal having the source potential Vcc level to the read data bus RD and supplies a reference signal having the ground potential Vss level to the read data bus RDB.

Since the NMOSs 22 and 25 are both turned on in this case, the potential level at the node N21 is lowered from the source potential Vcc level to the ground potential Vss level. Since the NMOS 21 is turned off at this time, the potential level on the column line CL is maintained at the precharged source potential Vcc level. The potential level on the column line CL is supplied to the decision circuit 104 through the fourth switch means SW4. The decision circuit 104 compares the potential level (source potential Vcc level) on the column line CL with a potential level of an expected value signal VR and outputs a decision result "non-defect" indicative of the fact that "data supplied to each bit line is normal".

On the other hand, when the potential level on the bit line BL becomes the source potential Vcc level and the potential level on the bit line BLB reaches the ground potential Vss level even when a test similar to the above-described test is executed, the read circuit CAM is activated as follows:

Namely, the NMOS 23 is turned off and both the NMOSs 22 and 24 are not turned on because the potential level at the node N21 is of a source potential Vcc level at the initial state of the read circuit CAM and the potential level at the node N22 is of a source potential Vcc level. Since the node N21 holds the source potential Vcc level at the initial state, the NMOS 21 is turned on so that the potential level on the column line CL is lowered from a precharged source potential Vcc level to an MEB potential level (corresponding to a level reduced by a predetermined potential from the source potential Vcc level).

The potential level on the column line CL is supplied to the decision circuit 104 through the fourth switch means SW4. The decision circuit 104 compares the potential level (MEB potential level) on the column line CL and a potential level of an expected value signal VR and outputs a decision result "defect or failure" indicative of the fact that "data supplied to each bit line is erroneous".

When the read circuit CAM enters a read operation, the read data buses RD and RDB are precharged to the source potential Vcc level by an unillustrated precharge means.

After the read control signal φRE has been changed from the ground potential Vss to the source potential Vcc (the node N21 has been brought to the ground potential Vcc level because the NMOS 26 is turned on), a column line CL for a selected column becomes the source potential Vcc level (NMOSs 24 and 25 are turned on) so that data is read into the read data buses RD and RDB.

Namely, since the NMOS 22 (or NMOS 23) connected to the bit line BL (or bit line BLB) of the bit line pair, which is supplied with high-level data (data "1"), is turned on, the potential level on the read data bus RD (or read data bus RDB) changes. On the other hand, the potential level on the read data bus RDB (or read data bus RD) remains unchanged. The data is read according to the difference between the potential levels on the read data buses RD and RDB.

According to the present embodiment, since the one-stage transistor can change the level on the column line, a higher-speed operation can be achieved. By setting the potential level on the column line to be changed, to a desired one of levels ranging from the ground potential level to less than the source potential level, information can be transferred with small amplitude and a high-speed operation is eventually allowed.

Figure 29:
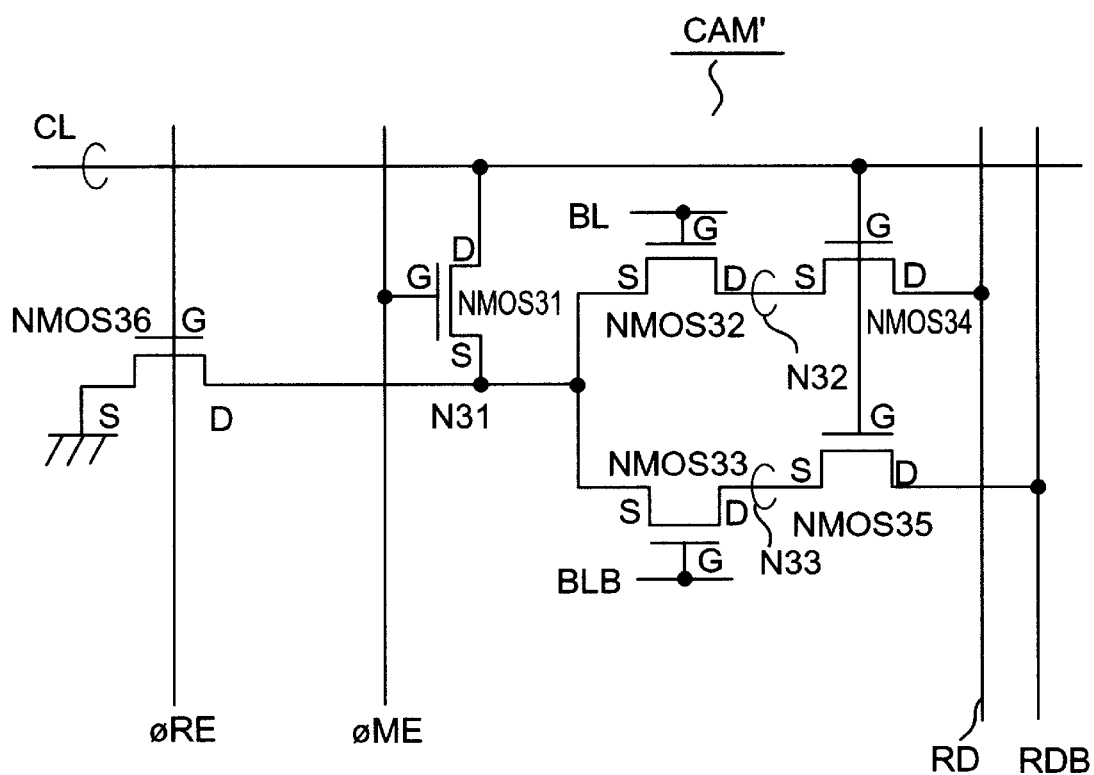
FIG. 29 is a partial circuit block diagram showing a fourteenth embodiment of the present invention.

A fourteenth embodiment of the present invention will next be described with reference to FIG. 29. Another example of the configuration of the aforementioned read circuit CAM is illustrated in the present embodiment. A specific description of the configuration of the above read circuit CAM and a specific description about how the potential on each column line changes upon a test operation will be made centrally in the following description.

This type of read circuit CAM' comprises an NMOS 31 having a drain electrode electrically connected to a column line CL, a source electrode electrically connected to a node N31 and a gate electrode supplied with a CAM control signal φME, an NMOS 32 having a drain electrode electrically connected to a node N32, a source electrode electrically connected to the node N31 and a gate electrode electrically connected to one bit line BL of a bit line pair, an NMOS 33 having a drain electrode electrically connected to a node N33, a source electrode electrically connected to the node N31 and a gate electrode electrically connected to the other bit line BLB of the bit line pair, an NMOS 34 having a drain electrode electrically connected to a read data bus RD, a source electrode electrically connected to the node N32 and a gate electrode electrically connected to the column line CL, an NMOS 35 having a drain electrode electrically connected to a read data bus RDB, a source electrode electrically connected to the node N33 and a gate electrode electrically connected to the column line CL, and an NMOS 36 having a drain electrode electrically connected to the node N31, a source electrode electrically connected to a ground potential GND and a gate electrode supplied with a read control signal φRE.

When the read circuit CAM' is brought to the test operation mode described in the aforementioned twelfth embodiment, the level of the read control signal φRE becomes a ground potential Vss level and the level of the CAM control signal φME is changed from the ground potential Vss level to a boost potential VBOOST level increased by a predetermined potential from a source potential Vcc level. The column line CL is precharged to the source potential Vcc level by a precharge circuit PCC. Accordingly, the potential level at the node N31 is brought to the source potential Vcc level.

As described in other embodiments referred to above, the potential corresponding to the data stored in each memory cell is thereafter amplified by its corresponding sense amplifier and the amplified potential appears on its corresponding bit line pair.

Afterward, when, for example, a test is executed that the potential level on the bit line BL is expected to be the source potential Vcc level and the potential level on the bit line BLB is expected to be the ground potential Vss level, a reference signal generator REFG supplies a reference signal having the source potential Vcc level to the read data bus RD and supplies a reference signal having the ground potential Vss level to the read data bus RDB.

Since, in this case, the potential level of the read data bus RD is of the source potential Vcc level, the potential level at the node N31 is of the source potential Vcc level, the potential level on the bit line BL is of the source potential Vcc level and the potential level on the bit line BLB is of the ground potential Vss level, the NMOSs 32 and 34 are not turned on and the NMOS 33 is turned off. Accordingly, the potential level at the node N31 is maintained at the source potential Vcc level and the potential level on the column line CL is also maintained at the precharged source potential Vcc level.

The potential level on the column line CL is supplied to the decision circuit 104 through the fourth switch means SW4. The decision circuit 104 compares the potential level (source potential Vcc level) on the column line CL and a potential level of an expected value signal VR and outputs a decision result non-defect indicative of the fact that "data supplied to each bit line is normal".

On the other hand, when the potential level on the bit line BL becomes the ground potential Vss level and the potential level on the bit line BLB becomes the source potential Vcc level even when a test similar to the above one is carried out, the present read circuit CAM' is activated as follows:

Since the potential level on the read data bus RDB is of the ground potential Vss level, the potential level at the node N31 is of the source potential Vcc level, the potential level on the bit line BL is of the ground potential Vss level and the potential level on the bit line BLB is of the source potential Vcc level, the NMOSs 33 and 35 are turned on. As a result, the potential level on the column line CL begins to be discharged from the source potential Vcc level to the ground potential Vss level through the NMOS 31, NMOS 33 and NMOS 35. When the potential level on the column line CL connected to the gate electrode of the NMOS 35 reaches a threshold Vt level of the NMOS 35, the NMOS 35 is turned off. Accordingly, the potential level on the column line CL becomes the threshold Vt level of the NMOS 35.

The potential level on the column line CL is supplied to the decision circuit 104 through the fourth switch means SW4. The decision circuit 104 compares the potential level (threshold Vt level) on the column line CL and a potential level of an expected value signal VR and outputs a decision result "defect or failure" indicative of the fact that "data supplied to each bit line is erroneous".

When, for example, a test is executed that the potential level on the bit line BL is expected to be the ground potential Vss level and the potential level on the bit line BLB is expected to be the source potential Vcc level, the reference signal generator REFG supplies a reference signal having the ground potential Vss level to the read data bus RD and supplies a reference signal having the source potential Vcc level to the read data bus RDB.

Since, in this case, the potential level of the read data bus RD is of the ground potential Vss level, the potential level at the node N31 is of the source potential Vcc level, the potential level on the bit line BL is of the ground potential Vss level and the potential level on the bit line BLB is of the source potential Vcc level, the NMOSs 33 and 35 are not turned on and the NMOS 32 is turned off. Accordingly, the potential level at the node N31 is maintained at the source potential Vcc level and the potential level on the column line CL is also maintained at the precharged source potential Vcc level.

The potential level on the column line CL is supplied to the decision circuit 104 through the fourth switch means SW4. The decision circuit 104 compares the potential level (source potential Vcc level) on the column line CL and a potential level of an expected value signal VR and outputs a decision result "non-defect" indicative of the fact that "data supplied to each bit line is normal".

On the other hand, when the potential level on the bit line BL becomes the source potential Vcc level and the potential level on the bit line BLB becomes the ground potential Vss level even when a test similar to the above one is carried out, the present read circuit CAM' is activated as follows:

Since the potential level on the read data bus RDB is of the source potential Vcc level, the potential level at the node N31 is of the source potential Vcc level, the potential level on the bit line BL is of the source potential Vcc level and the potential level on the bit line BLB is of the ground potential Vss level, the NMOSs 32 and 34 are turned on. As a result, the potential level on the column line CL begins to be discharged from the source potential Vcc level to the ground potential Vss level through the NMOS 31, NMOS 32 and NMOS 34. When the potential level on the column line CL connected to the gate electrode of the NMOS 34 reaches a threshold Vt level of the NMOS 34, the NMOS 34 is turned off. Accordingly, the potential level on the column line CL becomes the threshold Vt level of the NMOS 34.

The potential level on the column line CL is supplied to the decision circuit 104 through the fourth switch means SW4. The decision circuit 104 compares the potential level (threshold Vt level) on the column line CL and a potential level of an expected value signal VR and outputs a decision result "defect or failure" indicative of the fact that "data supplied to each bit line is erroneous".

When the read circuit CAM' enters a read operation, the CAM control signal φ ME is brought to the ground potential Vss level and the read data buses RD and RDB are precharged to the source potential Vcc level by an unillustrated precharge means. After the read control signal φ RE has been changed from the ground potential Vss to the source potential Vcc (the node N31 has been brought to the ground potential Vss level with the turning on of the NMOS 36), a column line CL for a selected column is brought to the source potential Vcc level (the NMOSs 34 and 35 are turned on) so that data is read into the read data buses RD and RDB.

Namely, since the NMOS 32 (or NMOS 33) connected to the bit line BL (or bit line BLB) of the bit line pair, which is supplied with high-level data (data "1"), is turned on, the potential level on the read data bus RD (or read data bus RDB) changes. On the other hand, the potential level on the read data bus RDB (or read data bus RD) remains unchanged. The data is read according to the difference between the potential levels on the read data buses RD and RDB.

According to the present embodiment, the read circuit can be realized with a less reduced number of elements as compared with the read circuit employed in the thirteenth embodiment. Further, since the potential level on each column line is discharged only between the source potential level and the threshold Vt level, a reduction in power consumption can be expected.

Figure 30:
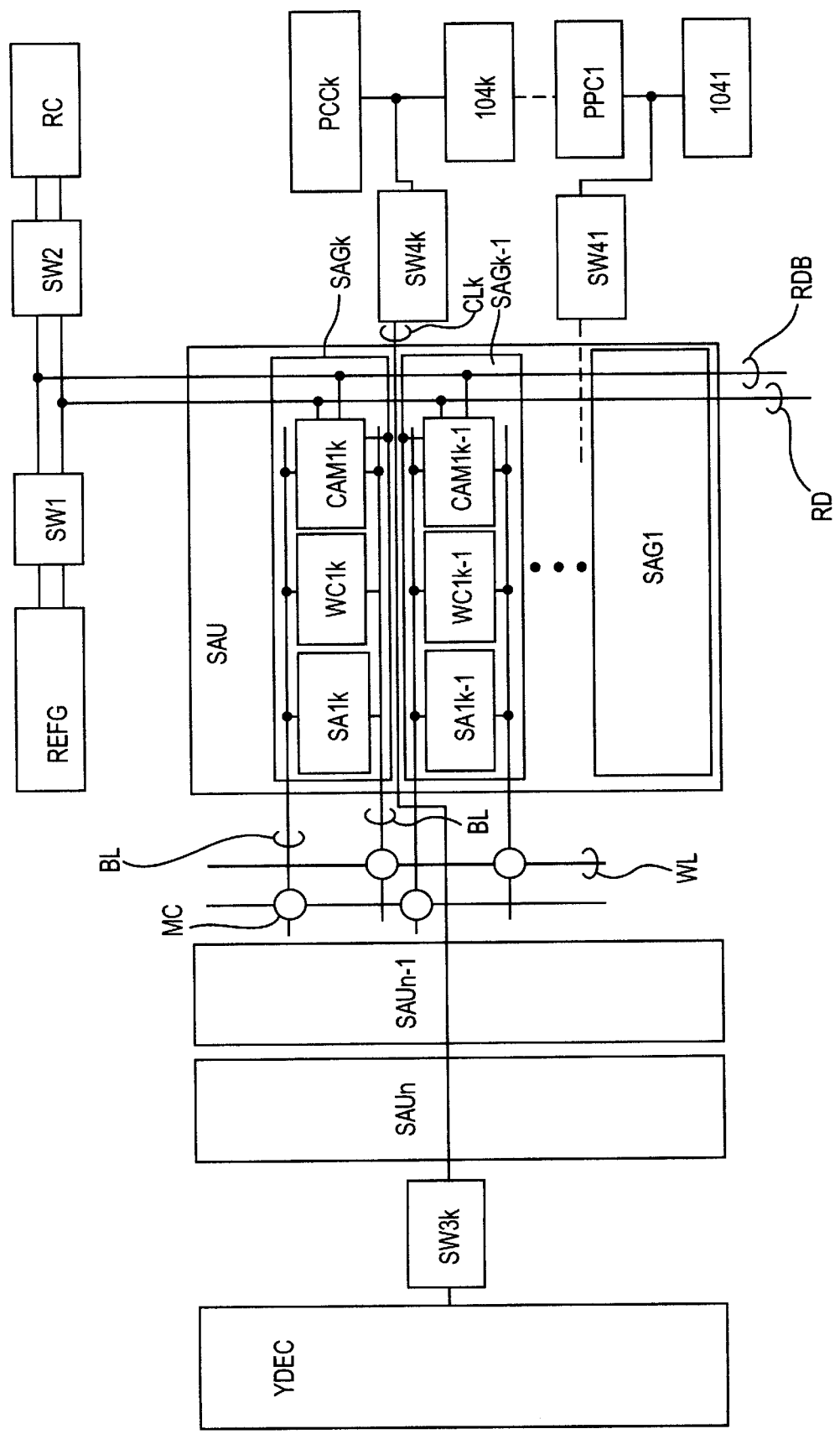
FIG. 30 is a partial circuit block diagram illustrating a fifteenth embodiment of the present invention.

A fifteenth embodiment of the present invention will next be described with reference to FIG. 30. The configuration and operation of the present embodiment will be basically explained by reference to the description of the twelfth embodiment referred to above.

The read circuit CAM1$k$ and the read circuit CAM1$k$-1 employed in the aforementioned twelfth embodiment are commonly connected to a column line CLk.

According to such a construction, when defective portions exist in either one of two sense amplifier groups SAGk and SAGk-1 or both of them, a change in potential occurs in each column line in a manner similar to the twelfth embodiment referred to above. Accordingly, the normal or erroneous information of the two sense amplifier groups SAG$k$ and SAG$k$-1 can be compressed onto one column line. Namely, since the information to be transferred is reduced in number, the test can be performed at high speed.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

According to the construction of the present invention, since a defective one of memory cells is specified, it can be efficiently replaced by a spare memory cell in a redundancy relieving process corresponding to a process subsequent to the execution of this specifying test. Namely, since only the defective memory cell can be replaced by the spare memory cell during the redundancy relieving process, unnecessary waste of the spare memory cell can be eliminated and the time necessary for its replacement can be greatly shortened.

A lot of time is normally required upon the redundancy relieving process. Therefore, since the shortening of the time by such a construction contributes to a reduction in cost, the shortening of a period up to the supply of products, etc., a very great effect can be expected in a semiconductor field. Further, since a test means can be realized by such a simple configuration that only address data indicative of defective portions can be stored, the test means is available at low cost.

According to another construction of the present invention, only addresses indicative of memory cells in which defects or failures have occurred, are specified and successively outputted to a test means. It is therefore possible to greatly shorten a test time interval necessary for the subsequent redundancy relieving process. Further, since the test means can be realized by such a simple structure that only address data indicative of defective portions can be stored, the test means is available at low cost.

According to a further construction of the present invention, since a handshake control circuit can be activated by detecting the state of the nextstage handshake control circuit, the handshake control circuit can transfer address data independently of dock signals without waiting for in clock signals. Thus, a higher-speed operation can be achieved.

According to a still further construction of the present invention, since a handshake control circuit detects the state of the following-stage handshake control circuit and transfers data, it can collect the data at high speed when the results of decisions indicative of the data "1" (i.e., the results of decisions each indicative of "defect or failure") are reduced in number.

According to a still further construction of the present invention, since no collision occurs between levels at the time of the transition of a handshake control circuit from the initial state to an operating state occurs and no transfer gate is provided on a data transmission route or path, a high-speed and stable operation can be expected.

According to a still further construction of the present invention, when either one of high and low levels is used in a handshake control circuit, the number of elements in the handshake control circuit can be reduced and since no transfer gate is provided on a data transmission route or path, a high-speed and stable operation can be expected. Further, since the levels at all the nodes on principal transmission paths are determined in the initial state, a stabler operation can be expected.

According to a still further construction of the present invention, since test management devices used upon testing of target devices are provided outside scribe lines which surround the target devices respectively, each high-function test management device can be designed without any restrictions on a circuit size of each target device. Since the high-function test management device can be realized in this way with the increase in the degree of freedom of the design on each test management device, a test time interval can be shortened even to a device whose circuit size is so strictly restricted. Further, since the design of a layout of each test management device can be performed independently of that of a layout of each target device, the test management device can be designed with high general versatility. Moreover, the test management device can be applied to various devices by changing interfaces alone.

According to a still further construction of the present invention, since metal interconnections are not exposed after a scribe line region SL has been cut during the subsequent scribe process, excellent moisture resistance can be expected. Further, since shavings produced during the scribe process are of polysilicon or polysilicide substantially identical in composition to a substrate, the influence of the shavings on the surroundings can be minimized in the subsequent assembly process.

According to a still further construction of the present invention, test management devices and interfaces provided within a general memory LSI having a peripheral circuit region formed in the center of a circuit are electrically connected to one another by the shortest patterns or interconnections through connecting means. Thus, interconnections used to connect a number of target devices and test management devices to one another are no longer routed within the target devices. Further, since the test management devices are provided in divided form, the respective management devices can be also activated in parallel, so that a further reduction in test time can be carried out.

According to a further construction of the present invention, since column lines, which have heretofore been used only for mere column selection, can be used as lines from which data are read, upon a test operation owing to the provision of first through fourth switch means, i.e., each column line used upon the normal operation and the line from which the data is read, can be commonly used, a structure having a function similar to that of a very complex and large-scale structure which has heretofore been considered to be necessary for specifying portions in which defective data have occurred, can be realized in a very simple and small-scale configuration.

According to a still further construction of the present invention, since a one-stage transistor can change the level on each column line, a higher-speed operation can be achieved. By setting the potential level on the column line to be changed, to a desired one of levels ranging from a ground potential level to less than a source potential level, information can be transferred with small amplitude and a high-speed operation is eventually allowed.

According to a still further construction of the present invention, a read circuit can be realized with a less reduced number of elements. Further, since the potential level on each column line is discharged only between a source potential level and a threshold Vt level, a reduction in power consumption can be expected.

What is claimed is:

1. A semiconductor device formed on a wafer, comprising:
   a semiconductor memory circuit; and
   a test circuit for testing the semiconductor memory circuit;
   wherein said semiconductor memory circuit includes a plurality of memory cells disposed in the form of a matrix having rows and columns for respectively storing data therein, and is activated based on a test pattern so as to generate the data stored in the respective memory cells for every column as output data; and
   wherein said test unit includes:
      a test pattern generator, which generates said test pattern indicative of a type of test to be performed and an expected value to be obtained by testing according to the test pattern, in response to a received command;
      a decision unit, which compares the output data with the expected value and generates a result of the comparison; and
      a translation unit, which converts the result of the comparison into address data and generates the address data.

2. A semiconductor device as claimed in claim 1, wherein said semiconductor memory circuit comprises
   bit lines to which the output data are provided;
   sense amplifiers for amplifying the output data provided to said bit lines; and
   column switches connected between said bit lines and a pair of data buses, said sense amplifiers and said column switches being respectively controlled based on column signals supplied by column lines arranged in a direction of said columns.

3. A semiconductor device as claimed in claim 1, wherein:
   said decision unit comprises a plurality of decision circuits equal in number to a number of said columns and respectively associated with said columns; and
   said translation unit comprises
      a plurality of flag circuits respectively corresponding to said plurality of decision circuits, and
      a plurality of translation circuits respectively corresponding to said plurality of flag circuits, each said flag circuit being brought to a first state when the result of the comparison generated by said corresponding decision circuit is normal and being brought to a second state when the result of the comparison is abnormal, and each said translation circuit storing therein an address for a memory cell from which data indicative of an abnormal condition has been received, when said flag circuit is placed in the second state and providing the address to said test circuit.

4. A semiconductor device as claimed in claim 3, wherein said translation unit further includes a plurality of buffer circuits, which respectively successively store therein addresses provided by said translation circuits and thereafter sequentially providing the stored addresses to said test circuit.

5. A semiconductor device as claimed in claim 1, wherein:
said decision unit comprises a plurality of decision circuits equal in number to a number of said columns and respectively associated with said columns; and
said translation unit comprises
a plurality of sequentially-connected translation circuits respectively corresponding to said plurality of decision circuits, and
a plurality of handshake control circuits respectively corresponding to said translation circuits, each said translation circuit storing therein an address for a memory cell from which data indicative of an abnormal condition has been provided, when the result of the comparison generated by said corresponding decision circuit is abnormal, and each said handshake control circuit detecting a state of a next-stage handshake control circuit, providing said address stored in said corresponding translation circuit to a next-stage translation circuit when the next-stage handshake control circuit is placed in a first state, and holding said address stored in said corresponding translation circuit when the next-stage handshake control is placed in a second state.

6. A semiconductor device as claimed in claim 5, wherein said handshake control circuit comprises
a first inverter having an input for receiving a first control signal;
a first transfer gate circuit, electrically connected between a first input terminal that is electrically connected to said decision circuit, and a first node, and having
a first N channel MOS transistor having a gate electrode for receiving the first control signal, and
a first P channel MOS transistor having a gate electrode that is electrically connected to an output of the first inverter;
a second transfer gate circuit, electrically connected between a second input terminal and the first node, and having
a second N channel MOS transistor having a gate electrode that is electrically connected to the output of the first inverter, and
a second P channel MOS transistor having a gate electrode for receiving the first control signal;
a third N channel MOS transistor having a drain electrode that is electrically connected to the first node and having source and gate electrodes for respectively receiving a ground potential and an initialization signal;
a first C element circuit having α, β and γ terminals that are respectively electrically connected to the first node, a third input terminal, and a second node;
a second C element circuit having α, β and γ terminals that are respectively electrically connected to the second node, a fourth input terminal, and a first output terminal;
a fourth N channel MOS transistor having a drain electrode that is electrically connected to the second node and having source and gate electrodes for respectively receiving the ground potential and the initialization signal;
a second output terminal electrically connected to the first node; and
a third output terminal electrically connected to the second node.

7. A semiconductor device as claimed in claim 6, wherein each of said first and second C element circuits comprises
third and fourth P channel MOS transistors that are electrically series connected between a source potential and a third node;
fifth and sixth N channel MOS transistors that are electrically series connected between the third node and the ground potential;
a second inverter that is electrically connected between the third node and the γ terminal; and
a third inverter that is electrically connected between gate electrodes of the third P channel MOS transistor and the sixth N channel MOS transistor, and the β terminal; and
wherein the α terminal is electrically connected to the gate electrodes of the fourth P channel MOS transistor and the fifth N channel MOS transistor.

8. A semiconductor device as claimed in claim 5, wherein said handshake control circuit comprises
a first inverter having an input for receiving a first control signal;
a first transfer gate circuit, electrically connected between a first input terminal that is electrically connected to said decision circuit, and a second input terminal, and having
a first N channel MOS transistor having a gate electrode for receiving the first control signal, and
a first P channel MOS transistor having a gate electrode that is electrically connected to the output of the first inverter;
a second P channel MOS transistor having drain and source electrodes that are respectively electrically connected to the second input terminal and a source potential, and having a gate electrode for receiving an initialization signal;
a second inverter having an input and an output that are respectively electrically connected to the second input terminal and a first node;
a first C element circuit having α, β and γ terminals that are respectively electrically connected to the first node, a third input terminal and a second node, a δ terminal for receiving the first control signal, and an η terminal that is electrically connected to the output of said first inverter;
a third inverter having an input and output that are respectively electrically connected to the second node and a third node;
a second C element circuit having α, β and γ terminals that are respectively electrically connected to the third node, a fourth input terminal and a first output terminal, a δ terminal for receiving the first control signal, and an η terminal that is electrically connected to the output of said first inverter; and
a third P channel MOS transistor having drain and source electrodes that are respectively electrically connected to the second node and the source potential and having a gate electrode for receiving the initialization signal.

9. A semiconductor device as claimed in claim 8, wherein each of said first and second C element circuits comprises fourth through sixth P channel MOS transistors that are electrically series-connected between the source potential and a fourth node;

second through fourth N channel MOS transistors that are electrically series-connected between the fourth node and a ground potential; and a fourth inverter electrically connected between gate electrodes of said fifth P channel MOS transistor and said third N channel MOS transistor, and the β terminal, wherein the α terminal is electrically connected to gate electrodes of said sixth P channel MOS transistor and said second N channel MOS transistor, the δ terminal is electrically connected to a gate electrode of said fourth P channel MOS transistor, and the η terminal is electrically connected to a gate electrode of said fourth N channel MOS transistor.

10. A semiconductor device as claimed in claim 5, wherein each said handshake control circuit comprises a first inverter having an input for receiving a first control signal;

a first transfer gate circuit, electrically connected between a first input terminal that is electrically connected to said decision circuit, and a second input terminal, and having
   a first N channel MOS transistor having a gate electrode for receiving the first control signal, and
   a first P channel MOS transistor having a gate electrode that is electrically connected to the output of the first inverter;

a second P channel MOS transistor having drain and source electrodes that are respectively electrically connected to the second input terminal and a source potential and having a gate electrode for receiving an initialization signal;

a second inverter having an input and an output that are respectively electrically connected to the second input terminal and a first node;

a first C element circuit having α, β, and γ terminals that are respectively electrically connected to the first node, a third input terminal, and a second node, and an η terminal that is electrically connected to the output of said first inverter;

a second inverter having an input and an output that are respectively electrically connected to the second node and a third node;

a second C element circuit having α, β, and γ terminals that are respectively electrically connected to the third node, a fourth input terminal, and a first output terminal, and an η terminal that is electrically connected to the output of said first inverter; and a third P channel MOS transistor having drain and source electrodes that are respectively electrically connected to the second node and the source potential and having a gate electrode for receiving the initialization signal.

11. A semiconductor device as claimed in claim 10, wherein each of said first and second C element circuits comprises fourth and fifth P channel MOS transistors that are electrically series-connected between the source potential and a fourth node;

second through fourth N channel MOS transistors that are electrically series connected between the fourth node and a ground potential; and a fourth inverter electrically connected between gate electrodes of said fourth P channel MOS transistor and said third N channel MOS transistor, and the β terminal, wherein the α terminal is electrically connected to gate electrodes of said fifth P channel MOS transistor and said second N channel MOS transistor, and the η terminal is electrically connected to a gate electrode of said fourth N channel MOS transistor.

12. A semiconductor device as claimed in claim 1, formed on a semiconductor wafer, wherein a semiconductor memory circuit region in which said semiconductor memory circuit is formed and a test management region in which said test pattern generator, said decision unit and said translation unit are formed, are separated by scribe lines corresponding to cutting estimated regions, and said semiconductor memory circuit, said test pattern generator and said decision unit are electrically connected to one another by connecting means including a plurality of conductor layers formed on the scribe lines.

13. A semiconductor device as claimed in claim 12, wherein the conductor layers of said connecting means are respectively connected to said semiconductor memory circuit, said test pattern generator and wiring layers of said decision unit by contact means at positions spaced away from the scribe lines, and each said contact means is covered with an insulating layer so as to avoid exposure to the scribe lines.

14. A semiconductor device as claimed in claim 13, wherein said test management region is divided into a first test management region and a second test management region, both of which are disposed in opposing relationship with said semiconductor memory circuit region interposed therebetween.

15. A semiconductor device as claimed in claim 1, formed on a semiconductor wafer, said semiconductor device including a semiconductor memory circuit region in which said semiconductor memory circuit is formed and a test management region in which said test pattern generator, said decision unit and said translation unit are formed, said test management region surrounding said semiconductor memory circuit region and being disposed on scribe lines corresponding to cutting estimated regions, and wherein said semiconductor memory circuit, said test pattern generator and said decision unit are connected to one another by connecting means including a plurality of conductor layers formed on the scribe lines.

16. A semiconductor device as claimed in claim 1, wherein said semiconductor memory circuit includes bit line pairs respectively connected to the memory cells;

a read circuit for varying the potential on a column according to a change in potential on each said bit line;

a column decoder connected to one end of each said column through a first switch means; and decision circuits connected to another end of each column through a second switch means, said first and second switch means being respectively brought into non-conduction and conduction upon a test operation so that said read circuit varies the potential on the column, whereby the potential on the column is compared with the expected value by each said decision circuit.

17. A semiconductor device as claimed in claim 16, further including a plurality of precharge circuits each supplying a source potential to the column, and wherein said read circuit comprises a first N channel MOS transistor having a drain electrode that is electrically connected to the column line, a source electrode for receiving a first control signal having a potential reduced by a predetermined potential from the source potential, and a gate electrode that is electrically connected to a first node;

a second N channel MOS transistor having a drain electrode that is electrically connected to a second node, a source electrode that is electrically connected to the first node, and a gate electrode that is electrically connected to one bit line of said each bit line pair;

a third N channel MOS transistor having a drain electrode that is electrically connected to a third node, a source electrode that is electrically connected to the first node, and a gate electrode that is electrically connected to the other bit line of said each bit line pair;

a fourth N channel MOS transistor having a drain electrode that is electrically connected to a first read data bus having one of the source potential and the ground potential, a source electrode that is electrically connected to the second node, and a gate electrode that is electrically connected to the column;

a fifth N channel MOS transistor having a drain electrode that is electrically connected to a second read data bus having the other of the source potential and the ground potential, a source electrode that is electrically connected to the third node, and a gate electrode that is electrically connected to the column;

a sixth N channel MOS transistor having a drain electrode that is electrically connected to the first node, a source electrode that is electrically connected to the ground potential, and a gate electrode for receiving a second control signal; and a precharge circuit for supplying the source potential to the first node.

18. A semiconductor device as claimed in claim 16, further including a plurality of precharge circuits each supplying a source potential to the column and wherein said read circuit comprises a first N channel MOS transistor having a drain electrode that is electrically connected to the column line, a source electrode that is electrically connected to a first node, and a gate electrode for receiving a first control signal having a potential higher than the source potential;

a second N channel MOS transistor having a drain electrode that is electrically connected to a second node, a source electrode that is electrically connected to the first node, and a gate electrode that is electrically connected to one bit line of said each bit line pair;

a third N channel MOS transistor having a drain electrode that is electrically connected to a third node, a source electrode that is electrically connected to the first node, and a gate electrode that is electrically connected to the other bit line of said each bit line pair;

a fourth N channel MOS transistor having a drain electrode that is electrically connected to a first read data bus having one of the source potential and a ground potential, a source electrode that is electrically connected to the second node, and a gate electrode that is electrically connected to the column;

a fifth N channel MOS transistor having a drain electrode that is electrically connected to a second read data bus having the other of the source potential and the ground potential, a source electrode that is electrically connected to the third node, and a gate electrode that is electrically connected to the column; and a sixth N channel MOS transistor having a drain electrode that is electrically connected to the first node, a source electrode that is electrically connected to the ground potential, and a gate electrode for receiving a second control signal.

19. An integrated device, comprising:

a semiconductor memory circuit, formed as a first internal component of the device; and a test circuit, formed as a second internal component of the device, for testing the semiconductor memory circuit, wherein the semiconductor memory circuit includes a plurality of memory cells disposed in the form of a matrix with rows and columns, for respectively storing data therein, and wherein the test circuit includes:
  means for generating, in response to any one of a plurality of commands, one of a plurality of test patterns corresponding to said one command and applying the generated test pattern to the memory cells, wherein the generated test pattern causes test data to be stored in each of the memory cells and provided as output data of the memory cells corresponding to the generated test pattern;
  means for generating a plurality of expected values corresponding to the generated test pattern;
  means for comparing the output data of the memory cells corresponding to the generated test pattern with respective expected values corresponding to the generated test pattern and generating a result of the comparison for each of the memory cells; and
  means for generating an address word that corresponds to the location of a defective one of the memory cells, for which the comparison result indicates that the output data is not identical to the respective expected value.

20. For an integrated device comprising an internal semiconductor memory circuit and an internal test circuit for testing the semiconductor memory device, which includes a plurality of memory cells disposed on the device in the form of a matrix with rows and columns for respectively storing data therein, a method for testing the semiconductor memory circuit, the method comprising:

generating, by the test circuit, in response to any one of a plurality of commands, one of a plurality of test patterns corresponding to said one command and applying the generated test pattern to the memory cells, wherein the generated test pattern causes test data to be stored in each of the memory cells and provided as output data of the memory cells corresponding to the generated test pattern;

generating, by the test circuit, a plurality of expected values corresponding to the generated test pattern;

comparing, by the test circuit, the output data of the memory cells corresponding to the generated test pattern with respective expected values corresponding to the generated test pattern and generating a result of the comparison for each of the memory cells; and generating, by the test circuit, an address word that corresponds to the location of a defective one of the memory cells, for which the comparison result indicates that the output data is not identical to the respective expected value.

21. A semiconductor device comprising a semiconductor memory circuit formed on a wafer, and a test circuit formed on the wafer for testing the semiconductor memory circuit, said semiconductor memory circuit having a plurality of memory cells disposed in the form of a matrix having rows and columns, for respectively storing data therein, and being activated based on a test pattern so as to generate the data stored in the respective memory cells for every column as output data, said test circuit comprising:
- a test pattern generator, which generates said test pattern indicative of a type of test to be performed, and an expected value to be obtained by testing according to the test pattern, in response to a received command;
- a decision unit, which compares the output data with the expected value and generates a result of the comparison; and
- a translation unit, which converts the result of the comparison into address data and generates the address data.

22. A device having a semiconductor memory circuit formed on a wafer, and a test circuit formed on the wafer for testing the semiconductor memory circuit, the semiconductor memory circuit having a plurality of memory cells disposed in the form of a matrix with rows and columns, for respectively storing data therein, the test circuit comprising:

means for generating, in response to any one of a plurality of commands, one of a plurality of test patterns, corresponding to said one command, and applying the generated test pattern to the memory cells, wherein the generated test pattern causes test data to be stored in each of the memory cells and provided as output data of the memory cells corresponding to the generated test pattern;

means for generating a plurality of expected values corresponding to the generated test pattern;

means for comparing the output data of the memory cells corresponding to the generated test pattern with respective expected values corresponding to the generated test pattern and generating a result of the comparison for each of the memory cells; and means for generating an address word that corresponds to the location of a defective one of the memory cells, for which the comparison result indicates that the output data is not identical to the respective expected value.

23. For a device having a semiconductor memory circuit formed on a wafer and a test circuit formed on the wafer for testing the semiconductor memory circuit, wherein the semiconductor memory circuit has a plurality of memory cells disposed in the form of a matrix with rows and columns for respectively storing data therein, a method for testing the semiconductor memory circuit, comprising:

generating, by the test circuit, in response to any one of a plurality of commands, one of a plurality of test patterns corresponding to said one command and applying the generated test pattern to the memory cells, wherein the generated test pattern causes test data to be stored in each of the memory cells and provided as output data of the memory cells corresponding to the generated test pattern;

generating, by the test circuit, a plurality of expected values corresponding to the generated test pattern;

comparing, by the test circuit, the output data of the memory cells corresponding to the generated test pattern with respective expected values corresponding to the generated test pattern and generating a result of the comparison for each of the memory cells; and generating, by the test circuit, an address word that corresponds to the location of a defective one of the memory cells, for which the comparison result indicates that the output data is not identical to the respective expected values.

* * * * *